(12) United States Patent
Round et al.

(10) Patent No.: US 8,942,960 B2
(45) Date of Patent: Jan. 27, 2015

(54) SCENARIO ANALYZER PLUG-IN FRAMEWORK

(71) Applicant: Schlumberger Technology Corporation, Sugar Land, TX (US)

(72) Inventors: Andrew John Round, Oxfordshire (GB); Gaute Johannes Gamst, Oslo (NO); James Major, Oxford (GB)

(73) Assignee: Schlumberger Technology Corporation, Sugar Land, TX (US)

( * ) Notice: Subject to any disclaimer, the term of this patent is extended or adjusted under 35 U.S.C. 154(b) by 46 days.

(21) Appl. No.: 13/785,645

(22) Filed: Mar. 5, 2013

(65) Prior Publication Data

US 2013/0238303 A1    Sep. 12, 2013

Related U.S. Application Data

(60) Provisional application No. 61/609,185, filed on Mar. 9, 2012.

(51) Int. Cl.
*G06F 17/50* (2006.01)
*G01V 99/00* (2009.01)

(52) U.S. Cl.
CPC ............ *G06F 17/5009* (2013.01); *G01V 99/00* (2013.01); *G01V 2210/74* (2013.01)
USPC ....... 703/2; 703/7; 703/10; 715/704; 715/751

(58) Field of Classification Search
CPC . G06F 17/5004; G06F 17/5086; G06F 9/445; G06F 17/5009; G01V 99/00; G01V 2210/74
USPC ............................ 703/2, 7, 10; 715/704, 751
See application file for complete search history.

(56) References Cited

U.S. PATENT DOCUMENTS

| | | | |
|---|---|---|---|
| 7,698,398 B1 * | 4/2010 | Lai ................................ | 709/223 |
| 8,572,633 B2 * | 10/2013 | Barros .......................... | 719/318 |
| 2009/0089028 A1 | 4/2009 | Sagert et al. | |
| 2010/0274367 A1 | 10/2010 | Kaufman et al. | |
| 2011/0153368 A1 | 6/2011 | Pierre et al. | |
| 2011/0307230 A1 | 12/2011 | Lee et al. | |
| 2012/0053971 A1 | 3/2012 | Ludvigsen et al. | |
| 2012/0151041 A1 * | 6/2012 | Gerber et al. ................ | 709/224 |
| 2012/0166967 A1 * | 6/2012 | Deimbacher et al. ......... | 715/751 |
| 2012/0225411 A1 * | 9/2012 | Puente ........................... | 434/224 |
| 2012/0232859 A1 * | 9/2012 | Pomerantz et al. ............... | 703/2 |
| 2013/0298018 A1 * | 11/2013 | Aqrawi et al. ................ | 715/704 |

OTHER PUBLICATIONS

PIPESIM (TM) simulation framework (Schlumberger Limited, Houston, TX).

* cited by examiner

*Primary Examiner* — Thai Phan
(74) *Attorney, Agent, or Firm* — Rodney Warfford; Lam Nguyen; Colin Wier

(57) ABSTRACT

A system can include a framework for scenario-based assessment of a physical environment; and an integrator that includes an analyzer component for identifying an analyzer as one of a plurality of identifiable analyzers, a scenario component for framework and analyzer interactions for a scenario, and a results component for framework and analyzer interactions with respect to analyzer results for the scenario. Various other apparatuses, systems, methods, etc., are also disclosed.

20 Claims, 15 Drawing Sheets

Fig. 12

SCENARIO ANALYZER PLUG-IN FRAMEWORK

RELATED APPLICATIONS

This application claims the benefit of U.S. Provisional Patent Application having Ser. No. 61/609,185, filed 9 Mar. 2012, entitled "Scenario Analyzer Plug-In Framework", which is incorporated by reference herein.

BACKGROUND

Various types of modules, frameworks, etc., exist for modeling geological formations, reservoirs, sedimentary basins, etc. Various methods, devices, systems, etc., are described herein that pertain to such technologies.

SUMMARY

A system can include a framework for scenario-based assessment of a physical environment; and an integrator that includes an analyzer component for identifying an analyzer as one of a plurality of identifiable analyzers, a scenario component for framework and analyzer interactions for a scenario, and a results component for framework and analyzer interactions with respect to analyzer results for the scenario. A method can include providing a framework for scenario-based assessment of a physical environment and an integrator that includes an analyzer component, a scenario component, and a results component; identifying an analyzer as one of a plurality of identifiable analyzers via the analyzer component; performing framework and analyzer interactions for scenario parameters for a scenario via the scenario component; running the scenario on the analyzer to generate analyzer results; and performing framework and analyzer interactions associated with the analyzer results for the scenario via the results component. One or more computer-readable media can include computer-executable instructions to instruct a computing system to: provide a framework for scenario-based assessment of a physical environment and an integrator that includes an analyzer component, a scenario component, and a results component; identify an analyzer as one of a plurality of identifiable analyzers via the analyzer component; perform framework and analyzer interactions for scenario parameters for a scenario via the scenario component; run the scenario on the analyzer to generate analyzer results; and perform framework and analyzer interactions associated with the analyzer results for the scenario via the results component. Various other apparatuses, systems, methods, etc., are also disclosed.

This summary is provided to introduce a selection of concepts that are further described below in the detailed description. This summary is not intended to identify key or essential features of the claimed subject matter, nor is it intended to be used as an aid in limiting the scope of the claimed subject matter.

BRIEF DESCRIPTION OF THE DRAWINGS

Features and advantages of the described implementations can be more readily understood by reference to the following description taken in conjunction with the accompanying drawings.

FIG. 12 illustrates an example of a graphical user interface;

DETAILED DESCRIPTION

The following description includes the best mode presently contemplated for practicing the described implementations. This description is not to be taken in a limiting sense, but rather is made merely for the purpose of describing the general principles of the implementations. The scope of the described implementations should be ascertained with reference to the issued claims.

Figure 1:
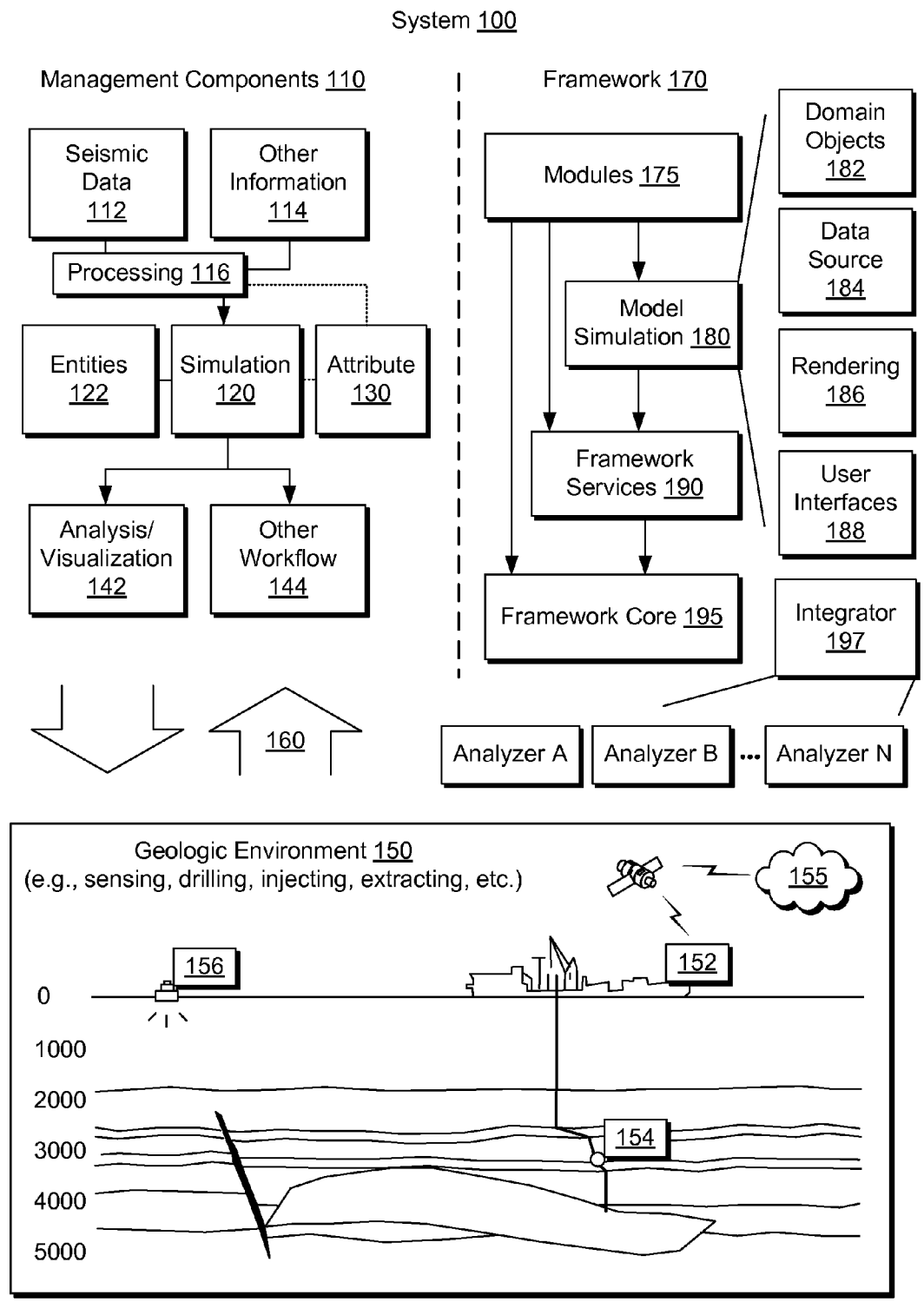
FIG. 1 illustrates an example system that includes various components for simulating a geological environment.

FIG. 1 shows an example of a system 100 that includes various management components 110 to manage various aspects of a physical environment such as a geologic environment 150. For example, the management components 110 may allow for direct or indirect management of sensing, drilling, injecting, extracting, etc., with respect to the geologic environment 150. In turn, further information about the geologic environment 150 may become available as feedback 160 (e.g., optionally as input to one or more of the management components 110).

In the example of FIG. 1, the management components 110 include a seismic data component 112, an information component 114, a processing component 116, a simulation component 120, an attribute component 130, an analysis/visualization component 142 and a workflow component 144. In operation, seismic data and other information provided per the components 112 and 114 may be input to the simulation component 120.

In an example embodiment, the simulation component 120 may rely on entities 122. Entities 122 may include earth entities or geological objects such as wells, surfaces, reservoirs, etc. In the system 100, the entities 122 can include virtual representations of actual physical entities that are reconstructed for purposes of simulation. The entities 122 may include entities based on data acquired via sensing, observation, etc. (e.g., the seismic data 112 and other information 114). As an example, an entity may represent a feature, a component, etc. spatially while a property or properties may specify one or more characteristics for the entity.

In an example embodiment, the simulation component 120 may rely on a software framework such as an object-based framework. In such a framework, entities may include entities based on pre-defined classes to facilitate modeling and simulation. A commercially available example of an object-based framework is the MICROSOFT®.NET™ framework (Redmond, Wash.), which provides a set of extensible object classes. In the .NET™ framework, an object class encapsulates a module of reusable code and associated data structures. Object classes can be used to instantiate object instances for use in by a program, script, etc. For example, borehole classes may define objects for representing boreholes based on well data.

In the example of FIG. 1, the simulation component 120 may process information to conform to one or more attributes specified by the attribute component 130, which may include a library of attributes (e.g., a library that may include seismic attributes and other attributes). Such processing may occur prior to input to the simulation component 120. Alternatively, or in addition, the simulation component 120 may perform operations on input information based on one or more attributes specified by the attribute component 130. In an example embodiment, the simulation component 120 may construct one or more models of the geologic environment 150, which may be relied on to simulate behavior of the geologic environment 150 (e.g., responsive to one or more acts, whether natural or artificial). In the example of FIG. 1, the analysis/visualization component 142 may allow for interaction with a model or model-based results. Additionally, or alternatively, output from the simulation component 120 may be input to one or more other workflows, as indicated by a workflow component 144.

In an example embodiment, the management components 110 may include features for geology and geological modeling to generate high-resolution geological models of reservoir structure and stratigraphy (e.g., classification and estimation, facies modeling, well correlation, surface imaging, structural and fault analysis, well path design, data analysis, fracture modeling, workflow editing, uncertainty and optimization modeling, petrophysical modeling, etc.). Particular features may allow for performance of rapid 2D and 3D seismic interpretation, optionally for integration with geological and engineering tools (e.g., classification and estimation, well path design, seismic interpretation, seismic attribute analysis, seismic sampling, seismic volume rendering, geobody extraction, domain conversion, etc.). As to reservoir engineering, for a generated model, one or more features may allow for simulation workflow to perform streamline simulation, reduce uncertainty and assist in future well planning (e.g., uncertainty analysis and optimization workflow, well path design, advanced gridding and upscaling, history match analysis, etc.). The management components 110 may include features for drilling workflows including well path design, drilling visualization, and real-time model updates (e.g., via real-time data links).

In an example embodiment, the management components 110 may include features of a commercially available simulation framework such as the PETREL® seismic to simulation software framework (Schlumberger Limited, Houston, Tex.). The PETREL® framework provides components that allow for optimization of exploration and development operations. The PETREL® framework includes seismic to simulation software components that can output information for use in increasing reservoir performance, for example, by improving asset team productivity. Through use of such a framework, various professionals (e.g., geophysicists, geologists, and reservoir engineers) can develop collaborative workflows and integrate operations to streamline processes. Such a framework may be considered an application and may be considered a data-driven application (e.g., where data is input for purposes of simulating a geologic environment, for purposes of analyzing a geologic environment, etc.).

As an example, the simulation component 120 may include one or more features of a simulator such as the ECLIPSE™ reservoir simulator (Schlumberger Limited, Houston Tex.), the INTERSECT™ reservoir simulator (Schlumberger Limited, Houston Tex.), etc. As an example, a reservoir or reservoirs may be simulated with respect to one or more enhanced recovery techniques (e.g., consider a thermal process such as SAGD, etc.). As an example, a simulator may accept as input a grid such as, for example, a grid for purposes of simulating one or more physical phenomena (e.g., via one or more numerical techniques).

In an example embodiment, various aspects of the management components 110 may include add-ons or plug-ins that operate according to specifications of a framework environment. For example, a commercially available framework environment marketed as the OCEAN® framework environment (Schlumberger Limited, Houston, Tex.) allows for integration of add-ons (or plug-ins) into a PETREL® framework workflow. The OCEAN® framework environment leverages .NET® tools (Microsoft Corporation, Redmond, Wash.) and offers stable, user-friendly interfaces for efficient development. In an example embodiment, various components may be implemented as add-ons (or plug-ins) that conform to and operate according to specifications of a framework environment (e.g., according to application programming interface (API) specifications, etc.).

FIG. 1 also shows an example of a framework 170 that includes a model simulation layer 180 along with a framework services layer 190, a framework core layer 195 and a modules layer 175. The framework 170 may include the commercially available OCEAN® framework where the model simulation layer 180 is the commercially available PETREL® model-centric software package that hosts OCEAN® framework applications. In an example embodiment, the PETREL® software may be considered a data-driven application. The PETREL® software can include a framework for model building and visualization. Such a model may include one or more grids.

The model simulation layer 180 may provide domain objects 182, act as a data source 184, provide for rendering 186 and provide for various user interfaces 188. Rendering 186 may provide a graphical environment in which applications can display their data while the user interfaces 188 may provide a common look and feel for application user interface components.

In the example of FIG. 1, the domain objects 182 can include entity objects, property objects and optionally other objects. Entity objects may be used to geometrically represent wells, surfaces, reservoirs, etc., while property objects may be used to provide property values as well as data versions and display parameters. For example, an entity object may represent a well where a property object provides log information as well as version information and display information (e.g., to display the well as part of a model).

In the example of FIG. 1, data may be stored in one or more data sources (or data stores, generally physical data storage devices), which may be at the same or different physical sites and accessible via one or more networks. The model simulation layer 180 may be configured to model projects. As such, a particular project may be stored where stored project information may include inputs, models, results and cases (e.g., scenarios). Thus, upon completion of a modeling session, a user may store a project. At a later time, the project can be accessed and restored using the model simulation layer 180, which can recreate instances of the relevant domain objects.

In the example of FIG. 1, the geologic environment 150 may be outfitted with any of a variety of sensors, detectors, actuators, etc. For example, equipment 152 may include communication circuitry to receive and to transmit information with respect to one or more networks 155. Such information may include information associated with downhole equipment 154, which may be equipment to acquire information, to assist with resource recovery, etc. Other equipment 156 may be located remote from a well site and include sensing, detecting, emitting or other circuitry. Such equipment may include storage and communication circuitry to store and to communicate data, instructions, etc.

In the example of FIG. 1, an integrator 197 may be provided that allows for integration of one or more analyzers (e.g., A, B, ... N). In an example embodiment, the integrator framework 197 may be part of the framework 170 and provide for "plugging-in" one or more analyzers.

As an example, an analyzer may be a simulator, a calculator, software, a software package, a framework, etc. As an example, an analyzer may include data or other information (e.g., optionally pointers, URLs, etc., for accessing information). Such data or other information may be associated with a scenario (e.g., a case). As an example, the integrator 197 may provide features that allow for integrating an analyzer with respect to the framework 170. As an example, a system may leverage functionality of the framework 170 and functionality of one or more analyzers integrated via the integrator 197. As an example, the integrator 197 (or another component or components) may provide for defining one or more worksteps suitable for forming a workflow.

In the example of FIG. 1, the geologic environment 150 may be outfitted with any of a variety of sensors, detectors, actuators, etc. For example, equipment 152 may include communication circuitry to receive and to transmit information with respect to one or more networks 155. Such information may include information associated with downhole equipment 154, which may be equipment to acquire information, to assist with resource recovery, etc. Other equipment 156 may be located remote from a well site and include sensing, detecting, emitting or other circuitry. Such equipment may include storage and communication circuitry to store and to communicate data, instructions, etc.

As an example, the framework 170 of FIG. 1 may provide interaction between an analyzer (e.g., or results therefrom, etc.) with equipment in the geologic environment 150 (e.g., for data acquisition, control, etc.). Such an approach may assist with production, exploration, drilling (e.g., torque, drag, etc.), etc.

In an example embodiment, a framework can include features that provide for scenario-based analysis (e.g., case-based analysis). Such a framework may be referred to as, for example, a scenario-based analysis framework. As an example, a framework may provide features that make it extensible and operational with respect to one or more analyzers. For example, consider the integrator 197 of FIG. 1, which may provide for interactions between one or more analyzers and the framework 170. As an example, a system may include a framework, an integrator and an analyzer. As mentioned, an analyzer may be, or include, a simulator, a calculator, software, a software package, a framework, etc.

In an example embodiment, a system can allow for transferability of end-user understanding, enhancement of familiarity in use and extensibility of various components. As an example, such a system may provide for extensibility of an analyzer, which may leverage native, non-native or both native and non-native functionality. As an example, such a system may provide for interoperability with one or more non-native functional modules, data structures, data files, etc. As an example, a system may include features to provide one or more objective functions, optimizers and worksteps (e.g., as in a workflow).

In an example embodiment, a framework can include features that allow for plug-in of a scenario analyzer (e.g., for purposes of leveraging functionality, sharing functionality, data, information, etc.). A scenario may be a "case" (e.g., as in a "case study") that includes various items, for example, that may be input to one or more modules (e.g., of an analyzer) for generation of results. As an example, a case may identify which parts of a model or models and data plus which configuration, context and reference elements form a particular model and data under consideration. As an example, a system may provide for scenario analysis to determine a best-case scenario, a worst-case scenario, etc. (e.g., based on analysis of a plurality of scenarios).

In an example embodiment, a framework can provide for integration of one or more types of analyzers (e.g., engines, simulators, calculators, etc.) to form a system that includes shared concepts including cases (e.g., scenarios), analyzer arguments and results. In such an example, integration of an analyzer, or analyzers, into a framework may provide for a similar "look and feel" as to tasks, visualizations, inputs, outputs, etc. Such an approach may enhance user experience (e.g., for an individual user, for multiple users, across an enterprise, across enterprises, etc.). As an example, a framework may provide for a "customized" analyzer that may include a custom mix of native and non-native functionality. For example, an analyzer may be customized through integration with a framework such that functionality of the framework and functionality of the analyzer may be utilized for purposes of assessing one or more cases (e.g., associated with a geologic environment).

As an example, a framework may include analyzer plug-in functionality. In such an example, the framework may include an integrator component (or components) that allow for plugging-in one or more analyzers. For example, consider the integrator 197 of FIG. 1.

In an example embodiment, a framework may allow implementations of one or more types of analyzers to be integrated with functionality of the framework (e.g., such as the PETREL® seismic to simulation software framework in the OCEAN® framework environment (Schlumberger Limited, Houston, Tex.)). As an example, an analyzer may define and encapsulate input (e.g., including model and data input plus arguments) as cases (e.g., as hosted in a cases tree in the PETREL® framework). As an example, for iterative workflows there may be multiple cases or a sequence of alterations or associated input modifiers encapsulated as an iterative case. As an example, an integrator may be provided to integrate one or more analyzers into a framework (e.g., optionally for performing one or more tasks associated with iterative workflows). In such an example, functionality provided by such one or more analyzers may be combined with native functionality of the framework (e.g., to enhance workflows, provide customized workflows, etc.).

As an example, an integrator may enable a commercially available simulation framework such as the PETREL® framework to integrate information, functionality or information and functionality associated with one or more analyzers. In turn, the framework may provide for construction of a "customized" analyzer (e.g., to provide features beyond those provided by an analyzer). As an example, a workflow may be created that includes one or more actions performed by an analyzer. As mentioned, through integration of an analyzer with a framework, a resulting system may provide analyzer functionality and framework functionality, optionally in one or more combinations that provide functionality beyond that of either the analyzer or framework (e.g., customized worksteps, workflows, cases, etc.).

As an example, for a scenario analyzer (e.g., or case analyzer), a scenario definition (e.g., or case definition) may be implemented along with the scenario analyzer to store both input settings and host or marshal related results. As an example, such results may be of one or more types native to a framework (e.g., the PETREL® framework such as line plots and grid results) and/or extensible to support customized types including non-time series output.

As an example, an analyzer may be integrated into an uncertainty and optimization process for a framework (e.g., the PETREL® framework), for example, for driving optimization, uncertainty and proxy workflows. As an example, an optimization framework may be extensible so that one or more of various types of optimizers, samplers, proxies or distributions integrated into a system can operate on the analyzer. As an example, a workflow itself may be customizable and may be extended with custom worksteps that become an integrated part of the workflow.

As an example, an analyzer may be integrated into a framework (e.g., via one or more integrator components) to be included as part of a workflow (e.g., an uncertainty workflow). A workflow may also include an objective function that may take results of an integrated analyzer, and use such input to create output for a next round of calculations. In such an example, an objective function may be extensible.

As an example, variables may be used as input by framework plug-ins (e.g., plug-ins to the OCEAN® framework) to one or more components of a system, for example, which may include worksteps where the variables can manipulate one or more parts of the arguments the workstep operates on. Consider, as an example, an optimization workflow with native and plugged-in worksteps driving a customized analyzer and evaluated by an objective function (which may also be extensible).

As a particular example, consider a commercially available framework environment marketed as the OCEAN® framework environment, which allows for integration of add-ons (or plug-ins) into a PETREL® framework workflow. The OCEAN® framework environment leverages .NET® tools (Microsoft Corporation, Redmond, Wash.). In this particular example, consider another a commercially available package marketed as the ECLIPSE® reservoir engineering software (Schlumberger Limited, Houston, Tex.). In this particular example, as to some aspects pertaining to file compatibility, one or more types of file formats may be associated with the ECLIPSE® software where one type of file format pertains to input files that may be generated in an export step from a model in the PETREL® framework (e.g., simulation controls by its internal code) and another type of file format that pertains to output files that may be imported into a model in the PETREL® framework (e.g., by its internal code). Also, an interface provided by the OCEAN® framework may allow for supplementing data, for example, by some amount of access to a model of the PETREL® framework. In the foregoing particular example mentioning the OCEAN®, the PETREL® framework and the ECLIPSE® software, features tend to be specific to two particular types of file formats associated with the ECLIPSE® software.

As an example, an integrator may be provided for a framework (e.g., such as the OCEAN® framework) to provide for integration of functionality associated with a software that may not be native to the framework. As an example, such an integrator may provide for integration of functionality of a simulator such as that of the ECLISPE® software. As to the aforementioned ECLIPSE® software (e.g., for reservoir simulation), it includes features that can apply a finite difference technique, which is a numerical technique that discretizes a physical space into blocks defined by a multidimensional grid. Numerical techniques may include equations for heat transfer, mass transfer, phase change, etc. As an example, a reservoir simulator may include equations to describe 3-phase behavior (e.g., liquid, gas, gas in solution), well and/or fracture regions, etc. As an example, an integrator may allow for interaction between such a simulator and a framework (e.g., for worksteps, workflows, cases/scenarios, etc.).

In various example embodiments, a framework may include features to assess integration of, and to integrate, data, functionality or data and functionality of an engine, a simulator, a calculator, etc., into the framework. Such a framework may provide for shared concepts relating to scenarios, analyzer arguments, results, etc. As an example, a framework that includes an integrator may optionally provide for a harmonious "look and feel" for interfaces, outputs, etc. As an example, data, functionality or data and functionality "plugged-in" to a framework via an integrator may provide for a harmonious visual and operational "look and feel" (e.g., a unified experience as may be expected from a single vendor product).

Figure 2:
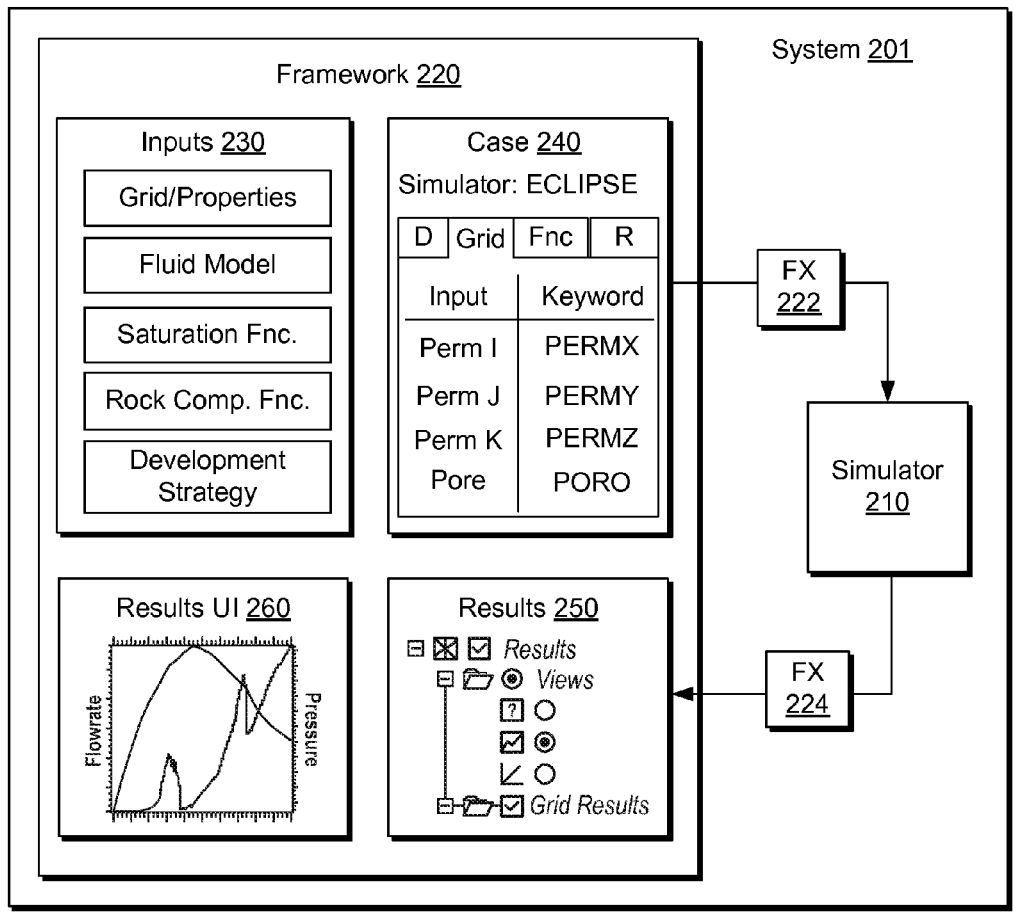
FIG. 2 illustrates an example of a system and an example of a method.
Figure 2:
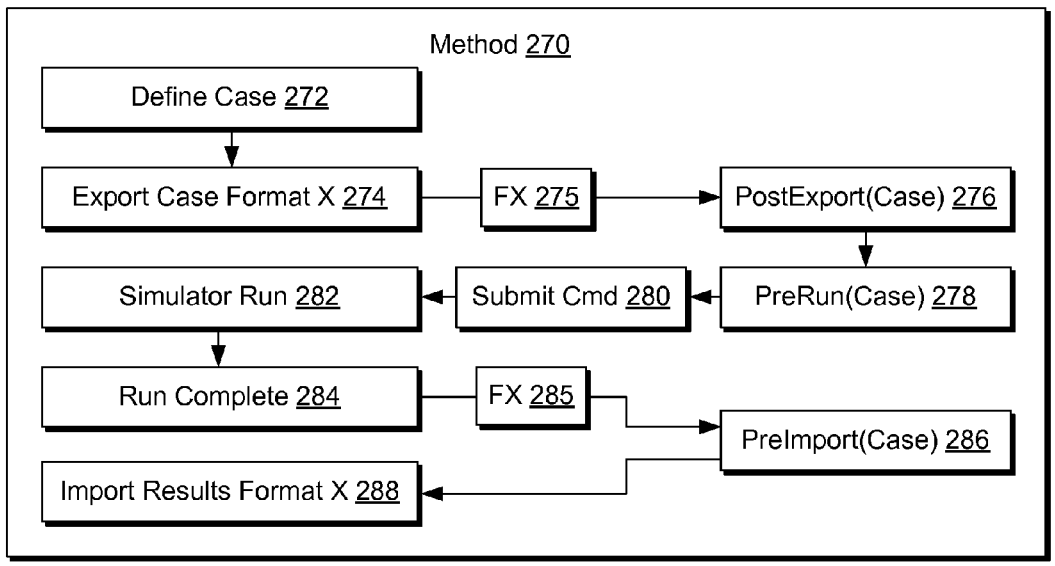

FIG. 2 shows an example of a system 201 that includes a simulator 210 and a framework 220 and an example of a method 270. In the example of FIG. 2, the simulator 210 can receive a file 222 having a particular format from the framework 220 and then output a file 224 having a particular format to the framework 220. Such file-based interaction according to a particular format may constrain user experience and extensibility of the framework 220, for example, with respect to an analyzer that may not conform to such a file-based approach where the file has a particular format.

As shown in the example of FIG. 2, the framework 220 includes an inputs block 230, a case block 240, a results block 250 and a results user interface (UI) block 260. The inputs block 230 may allow a user to specify inputs via a user interface of the framework 220, for example, consider inputs such as grid, properties, fluid model, saturation function, rock compression function, development strategy, etc. As an example, consider grid and property inputs via the input block 230 forming, at least in part, a case per the case block 240. As shown, such a case may be for a particular simulator (e.g., ECLIPSE® 100 simulator) where permeability and porosity for the grid are equated to "keywords", which may be associated with a particular format for a file an output file.

In the example of FIG. 2, the file 222 may include "keywords" for the case formulated by the case block 240 of the framework 220. In such an example, the simulator 210 receives the keywords, which are acceptable input for running a simulation (e.g., a case). In turn, after the simulator 210 runs the simulation for the case, it can format results according to a format suitable for receipt by the framework 220. In such an example, the simulator 210 formats its results and transmits the file 224 to the framework 220. As indicated by the results block 250 and the results UI block 260 of the framework 220, the results in the file 224 may be selected via a UI of the results block 250 and presented in another UI of the results UI block 260. In such a manner, where a simulator conforms to the file exchange approach (e.g., format, etc.), the framework 220 can construct a case, output case keywords to a simulator and then receive results from the simulator for selection and presentation to a user (e.g., via a display, etc.).

As an example, the framework 220 may be the PETREL® framework and the simulator 210 may be one of the ECLIPSE® family of simulators. In such a context, a case may bring together and identify which parts of a model or models and data plus which configuration, context and reference elements form the particular model and data under consideration. As an example, a "client" may be a software developer that does not have authority to modify source code of the PETREL® framework. In such an example, a so-called "ECLIPSE format file" for input to an ECLIPSE® simulator may be generated in an export step from the PETREL® framework while an "ECLIPSE format file" for output may be imported into the PETREL® framework via execution of an internal code module. As to the OCEAN® framework environment, an interface may provide a client to supplement the file data, for example, via access to a model in the PETREL® framework.

As to the method 270, it pertains to the system 201 for purposes of exporting a case definition and importing results for the defined case. As shown, a definition block 272 includes defining a case, an export block 274 exports the defined case in a particular format (e.g., format X or "FX"), as indicated by a file 275. A command block 276 performs a "post export" function for the case, a command block 278 performs a "pre run" function for the case and a submission block 280 submits a command to a simulation block 282 such that a simulator (e.g., the simulator 210) runs the case. The method 270 continues at a completion block 284 that includes outputting a case results file 285 in a particular format (e.g., format X or "FX"), a command block 286 performs a "pre import" function for importing the file 285 and an import block 288 indicates that the results for the case have been imported to the framework (e.g., the framework 220).

Figure 3:
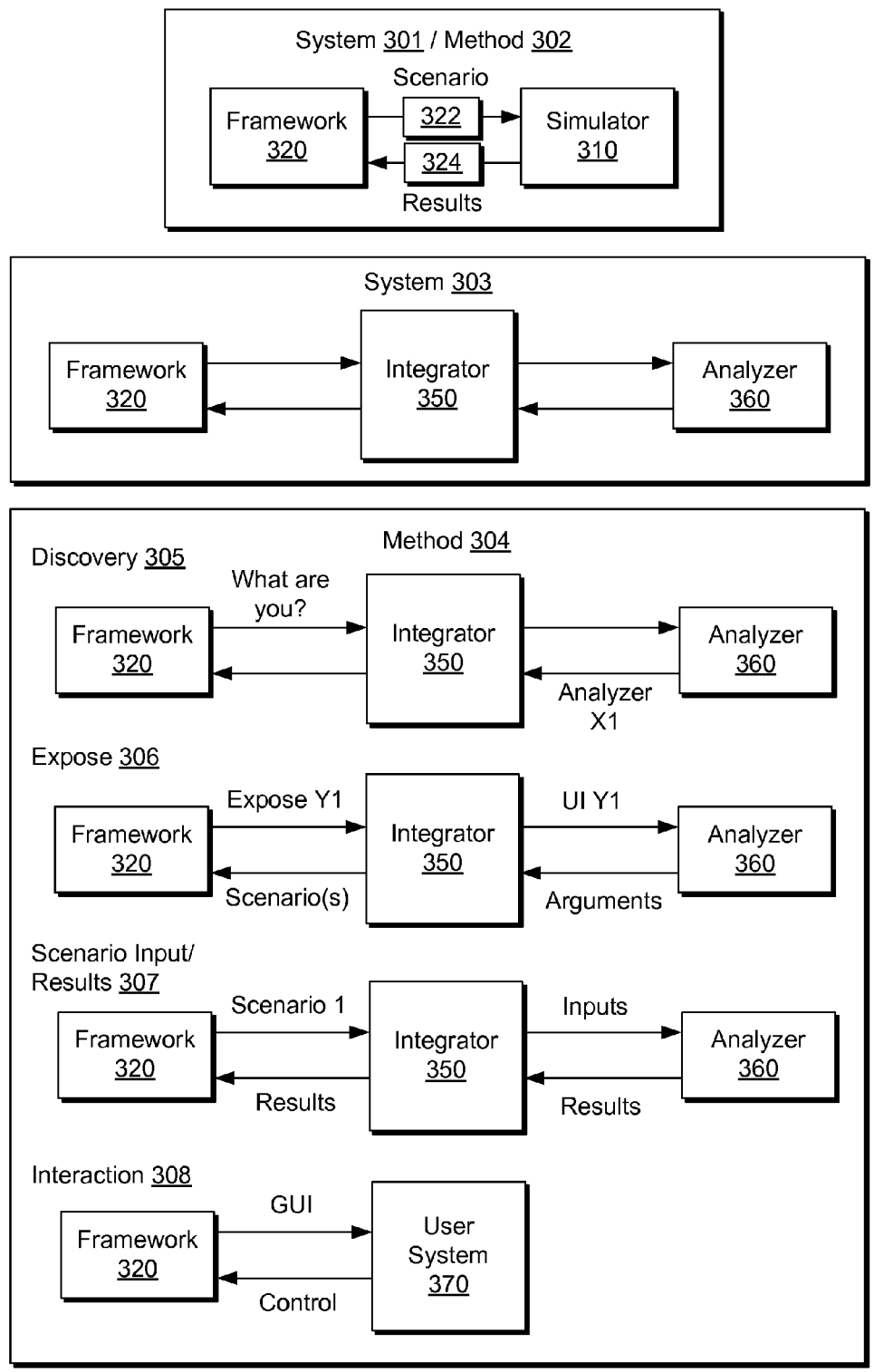
FIG. 3 illustrates examples of systems and examples of methods.

FIG. 3 shows an example of a system 301 and an associated a method 302 and an example of another system 303 and an associated example of a method 304. As shown, the system 301 includes a simulator 310 and a framework 320 where a scenario file 322 and a results file 324 may be transmitted in a particular format (e.g., using particular keywords). As to the method 302, it includes the framework 320 transmitting the scenario file 322 to the simulator 310 and the simulator 310 transmitting the results file 324 to the framework 320.

As to the system 303, it includes the framework 320, an integrator 350 and an analyzer 360, which may be selected from one of a plurality of analyzers. As to the method 304, in the example of FIG. 3, it includes a discovery process 305 where the framework 320 may discover information as to a type associated with the analyzer 360, an exposure process 306 where the framework 320 may instruct the integrator 350 to expose features of the framework 320 via a user interface and where the analyzer 360 may supply arguments via the integrator 350 for use in formulating one or more cases by the framework 320, a scenario input/results process 307 where the framework 320 may transmit a scenario to the integrator 350 and where inputs thereof may be transmitted to the analyzer 360 for purposes of running the scenario and returning results thereof to framework 320 via the integrator 350, and an interaction process 308 where the framework 320 may provide one or more graphical user interfaces (GUI) to a user system 370 (e.g., a computer, etc.) such that a user may interact with the framework 320 to select, edit, analyze, etc. results provided by the analyzer. As an example, such interactions may include formulating a subsequent scenario, a workstep, a workflow, etc., which may optionally repeat the method 304 using the analyzer 360 or one or more other analyzers (e.g., via the integrator 350). As shown in the example, method 304, the integrator provide for various types of framework and analyzer interactions (e.g., for scenario parameters, for scenario results generated by an analyzer, etc.).

Figure 4:
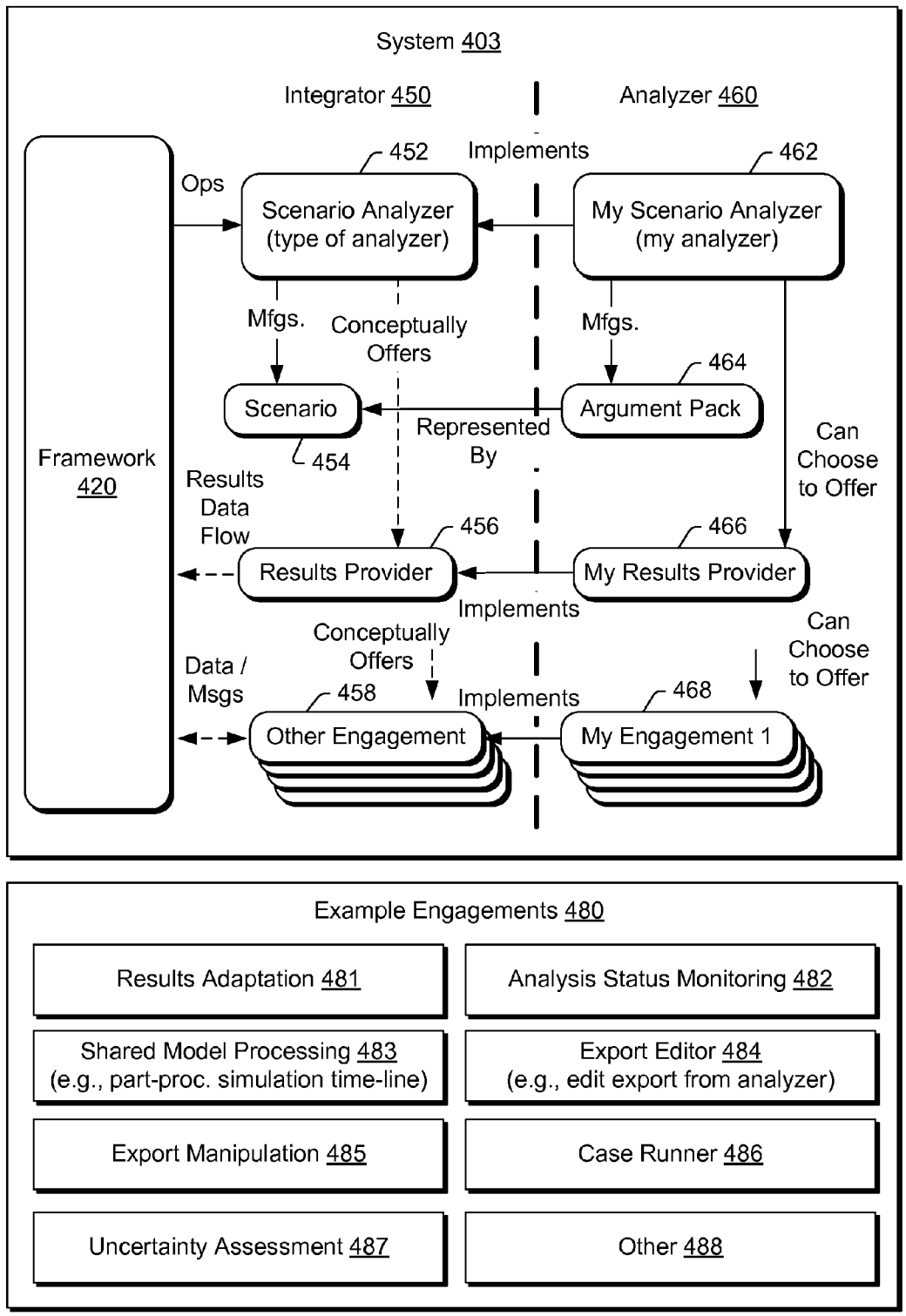
FIG. 4 illustrates an example of a system.

FIG. 4 shows an example of a system 403 that includes a framework 420, an integrator 450 and an analyzer 460. As an example, the integrator 450 may allow for plugging-in the analyzer 460 to the framework 420. In such a manner, the framework 420 may be configured for interactions with the analyzer 460, for example, to provide one or more customized worksteps, workflows, etc. In the example of FIG. 4, the integrator 450 may be implemented by the analyzer 460 such that the integrator 450 presents itself to the framework 420 (e.g., or within the framework 420) as the analyzer 460. For example, components of the integrator 450 may be flexible and extensible to "mimic" corresponding components of a plurality of different types of analyzers.

In the example of FIG. 4, the integrator 450 may include components such as a scenario analyzer component 452, a scenario component 454, a results provider component 456 and an engagements component 458 that interoperate with one or more components of an analyzer such as the analyzer 460. For example, the analyzer 460 may include components such as a scenario analyzer component 462, an argument pack component 464, a results provider component 466 and an engagements component 468 that interoperate with components of the integrator 450 such that the analyzer 460 may be plugged-in to the framework 420. As an example, the integrator 450 may be considered an interface that allows a framework to interface with one or more analyzers.

As an example, the integrator 450 may "represent" the analyzer 460 to the framework 420 (e.g., represent the analyzer 460 as being plugged-in to the framework 420 or part of the framework 420). For example, the scenario component 454 of the integrator 450 may represent arguments of an argument pack component 464 of the analyzer 460. In turn, the framework 420 may transmit scenario information to the integrator 450 as to one or more scenario that can be run by the analyzer 460 (e.g., according to its argument pack component 464). As indicated, results generated by the analyzer 460 may be passed from the results provider component 466 of the analyzer 460 to the results provider component 456 of the integrator 450, which, in turn, provide for results data flow to the framework 420.

In the example of FIG. 4, flexibility exists via the integrator 450 conceptually offering options as to engagements, for example, per the engagement component 458. The engagement component 458 may be implemented by an analyzer to provide for interactions with the framework 420, for example, which may include data exchanges, messaging, commands, etc. In the example of FIG. 4, the engagement component 468 of the analyzer 460 may implement the engagement component 458 of the interface 450, which, in turn, can allow for interactions with the framework 420.

FIG. 4 shows some examples of engagements 480 as including a results adaptation engagement 481, an analysis status monitoring engagement 482, a shared model processing engagement 483, an export editor engagement 484, an export manipulation engagement 485, a case runner engagement 486, an uncertainty assessment engagement 487 and one or more other engagements 488.

As to the results adaptation engagement 481, it may provide for adapting an analyzer's output data form into a form consumed by the framework (e.g., to allow for presentation, manipulation, etc. by one or more tools inside or connected to the framework). As an example, such an engagement may provide for consumption of partial results from on-going analysis by an analyzer.

As to the export manipulation engagement 485, an analyzer may be a separate program configured for receipt of input in the form of a file, a group of files, shared memory segments or other data pipe(s) or a mixture of these. Such forms may be deemed the "export" as they represent resources that a framework or tools in the framework may be able to interact with (e.g., manipulate). For example, consider: an end-user wants to delete the files to save disk space (e.g., free the resources); or an end-user wants to rename a scenario (a case) and expects the export files (or data pipes, shared memory segments) to be identified by the new name.

As to the analysis status monitoring engagement 482, an analyzer may utilize considerable resources, time, etc. A framework (e.g., or tools connected with the framework) may want to be able to present run progress information, or indicate resource usage, queue status etc. Such an engagement component may provide such functionality.

As to the export editor engagement 484, it may allow an existing editor UI in the framework to display a custom editing UI, for example, provided by a client, which may be configured for editing an export form of a scenario (e.g., a case).

As to the case runner engagement 486, it may include a CaseRunnerMonitor which a client can use to react to Run-Completed, RunAborted and Simulation ProgressChanged. As an example, for a progress changed engagement, it may be implemented, for example, to send an email when the job reaches, for example, a half-way point (e.g., or other condition).

As an example, an integrator can provide for plugging-in an analyzer such that existing capabilities of a framework (e.g., or other extensions pugged-in to the framework) may be able to deal with a client's particular type of scenario or analyzer (e.g., to build the scenarios/cases, to QC them, to analyze the results, to compare between analyzers, to manage remote analyzer execution etc.).

As an example, an integrator may be a behavioral application programming interface (API). As an example, an integrator may provide a specification to which an analyzer may adhere to for purposes of plugging-in to functionality of a framework. As an example, portions of a specification may be optional. For example, an analyzer developer may choose to what extent an analyzer comports with the specification. As an example, an analyzer may include one or more modules that can interact with one or more modules of a framework via an integrator. As an example, if a framework can provide a grid of a geologic environment (e.g., a pillar grid, finite element grid, finite volume grid, finite difference grid, etc.), where an analyzer can accept such a grid, it may do so via an integrator and, for example, perform a simulation using the grid and return one or more types of property values associated with the gird (e.g., nodes, grid cells, etc.) as simulation grid results, which, in turn, may be selected and presented by the framework (e.g., to a display). In such an example, results may be time-base results, for example, a simulation of one or more physical phenomena over time.

As an example, a system can include a framework for scenario-based assessment of a physical environment; and an integrator that includes an analyzer component for identifying an analyzer as one of a plurality of identifiable analyzers, a scenario component for framework and analyzer interactions for a scenario, and a results component for framework and analyzer interactions with respect to analyzer results for the scenario. As an example, such a system may include the analyzer component as being implementable by the analyzer, the scenario component as representing an argument pack of the analyzer, and the results component as being implementable by the analyzer.

As an example, a system may include a scenario component configurable by an analyzer component, for example, based at least in part on the analyzer component identifying an analyzer.

As an example, a system can include an integrator that includes an engagement component configured for framework and analyzer interactions for engagements between a framework and an identified analyzer (e.g., information exchanges, command exchanges, etc.). For example, such an engagement component may be implementable by an analyzer. As an example, an engagement component may provide for a plurality of implementable engagements. For example, consider one or more of results engagements, monitoring engagements, export engagements, scenario engagements, uncertainty assessment engagements, etc.

As an example, a system may include a framework that includes a workflow editor for associating one or more worksteps of a workflow with one or more of a plurality of identifiable analyzers. As an example, a framework may include a results component for selecting analyzer results (e.g., from one or more analyzers). For example, consider a results component that includes instructions for rendering a graphical user interface to a display where the graphical user interface includes one or more controls for selecting analyzer results.

As an example, a system may include a framework that operates according to worksteps of a workflow. In such an example, the worksteps of the workflow may include a workstep associated with one identifiable analyzer and another workstep associated with another identifiable analyzer (e.g., a different analyzer). As an example, worksteps of a workflow may include an assessment workstep for assessing analyzer results from a plurality of identifiable analyzers.

Figure 5:
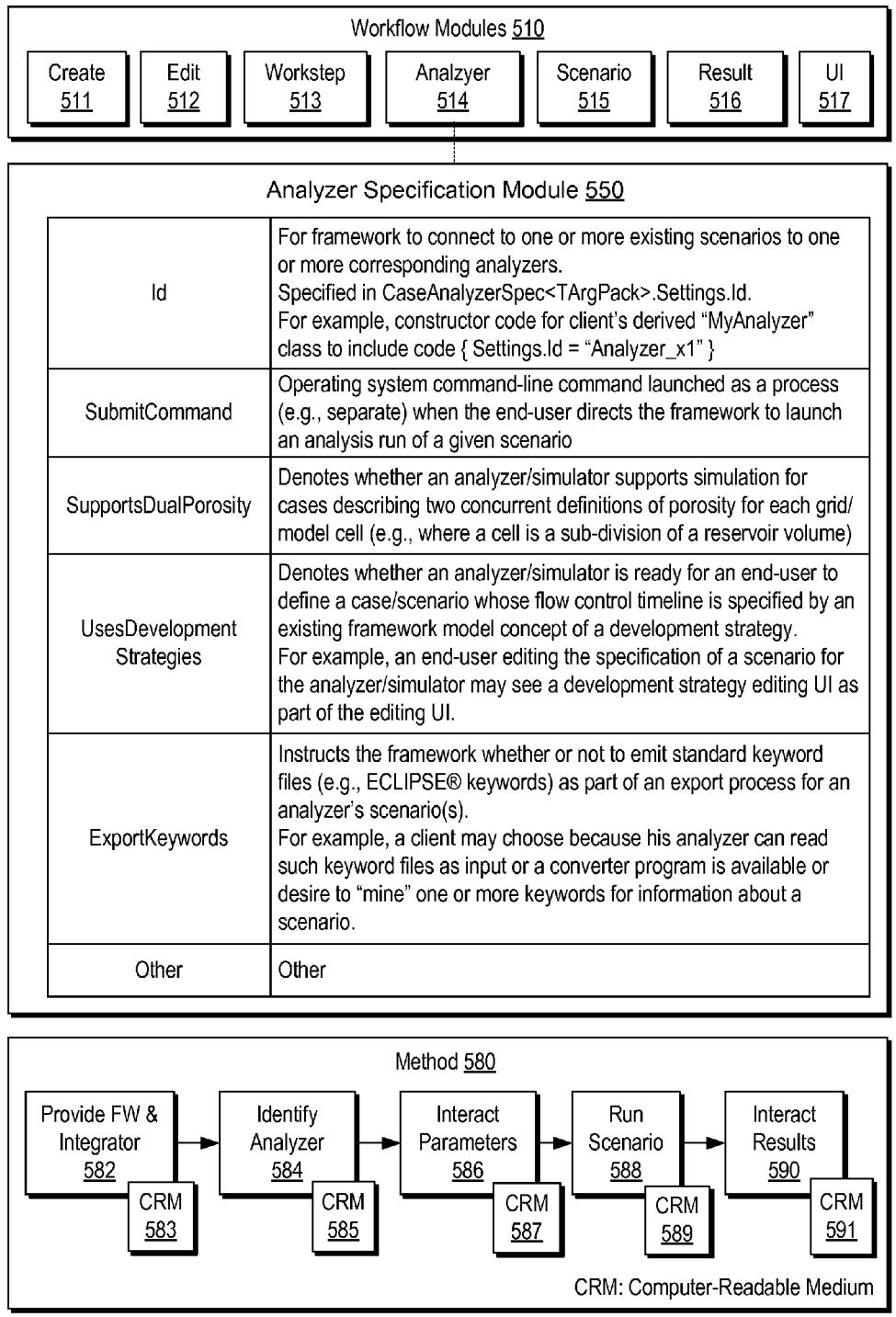
FIG. 5 illustrates an example of workflow modules, an example of an analyzer specification module and an example of a method.

FIG. 5 shows an example of workflow modules 510, an example of an analyzer specification module 550 and an example of a method 580. In FIG. 5, the workflow modules 510 include a workflow creation module 511, a workflow edit module 512, a workstep module 513, an analyzer module 514, a scenario module 515, a result module 516 and a UI module 517. In such an example, the analyzer module 514 may provide for specifying one or more analyzers from a plurality of analyzers that may be plugged-in to a framework configured to perform a workflow. In such an example, the framework may include an integrator such as the integrator 450 of FIG. 4.

As an example, the workflow modules 510 may be part of a framework that allow for associating a first analyzer with a workstep and a second analyzer with another workstep. In such an example, the scenario module 515 may provide for defining scenarios to be run by each of the analyzers and the result module 516 may provide for receiving results for the run scenarios. The UI module 517 may provide for selection of results from either or both scenarios, for example, as part of a workflow. An analysis of results presented by a UI or UIs may allow for defining one or more subsequent scenarios (e.g., to be run by one of the analyzers or another analyzer).

As an example, a workflow may aim to optimize one or more sets of parameters, for example, where each set of parameters may define a scenario. As a geologic environment may include one or more reservoirs, one or more wells, one or more surface networks, etc., a plurality of analyzers may be implemented using an integrator (or integrators) where scenario results are transmitted to a framework for an overall optimization analysis, for example, to select an optimized scenario, to define one or more additional scenarios as part of an optimization effort, etc.

As to the analyzer specification module 550, in the example of FIG. 5, it includes various fields such as an identification field, a submit command field, a support field, a development strategies field, an export field and one or more other fields.

As an example, the development strategies field (e.g., UsesDevelopmentStrategies) may allow for enhancing user experience, for example, to allow a client's simulator to use an existing and potentially already end-user familiar UI to specify the case/scenario control timeline for their own simulator.

As an example, an analyzer specification module 550 may include one or more features of a CaseAnalyzerSpec<TArgPack> class in the OCEAN® framework environment (e.g., for a PETREL® API, etc.). In such an example, <TArgPack> may be a C# syntax declaration of a generic class, for example, to allow writing an API definition referring to the concept of the arguments package (see, e.g., the scenario component 454 as representing the argument pack component 464). In such an example, a client-coder may include their own arg-pack as their concrete type.

As an example, an analyzer may be an analyzer developed by or running in, for example, the MATLAB® computing environment (marketed by MathWorks, Inc., Natick, Mass.). As an example, a workflow may include one or more worksteps that access a MATLAB® computing environment analyzer.

As shown in FIG. 5, the method 580 includes a provision block 582 for providing a framework for scenario-based assessment of a physical environment and an integrator that includes an analyzer component, a scenario component, and a results component; an identification block 584 for identifying an analyzer as one of a plurality of identifiable analyzers using the analyzer component; an interaction block 586 for performing framework and analyzer interactions for scenario parameters for a scenario (e.g., via the scenario component); a run block 588 for running the scenario on the analyzer to generate analyzer results (e.g., based at least in part on the scenario parameters); and an interaction block 590 for performing framework and analyzer interactions associated with the analyzer results for the scenario (e.g., via the results component). As an example, such a method may include providing a workflow that includes a workstep for requesting the analyzer results. As an example, a method may include providing a workflow that includes a workstep for requesting analyzer results from more than one of a plurality of identifiable analyzers. As an example, a method may include performing an uncertainty assessment, using a framework, for example, based at least in part on analyzer results from one or more analyzers.

The method 580 is shown in FIG. 5 in association with various computer-readable media (CRM) blocks 583, 585, 587, 589 and 591. Such blocks generally include instructions suitable for execution by one or more processors (or cores) to instruct a computing device or system to perform one or more actions. While various blocks are shown, a single medium may be configured with instructions to allow for, at least in part, performance of various actions of the method 580. As an example, a computer-readable medium (CRM) may be a computer-readable storage medium. As an example, the blocks 583, 585, 587, 589 and 591 may be provided as one or more modules, components, etc. (e.g., for storage in memory and execution by one or more processors of a computing device or system).

As an example, one or more computer-readable media can include computer-executable instructions to instruct a computing system to: provide a framework for scenario-based assessment of a physical environment and an integrator that includes an analyzer component, a scenario component, and a results component; identify an analyzer as one of a plurality of identifiable analyzers via the analyzer component; perform framework and analyzer interactions for scenario parameters for a scenario via the scenario component; run the scenario on the analyzer to generate analyzer results; and perform framework and analyzer interactions associated with the analyzer results for the scenario via the results component. As an example, instructions may be provided to instruct a computing system to provide an engagement component for framework and analyzer interactions for engagements between the framework and the identified analyzer. As an example, instructions may be provided for performing one of a plurality of engagements selected from a group of engagements (e.g., results engagements, monitoring engagements, export engagements, scenario engagements, uncertainty assessment engagements, etc.).

As an example, a system may include an integrator for plugging-in one or more simulators to simulate one or more scenarios (e.g., associated with a physical environment or other environment). As an example, a method may include creating a plurality of scenarios (e.g., with associated scenario parameters) and launching one or more simulators and monitoring the simulators as simulations are run (e.g., optionally interacting with the simulators to manipulate one or more of the simulations). As an example, such a method may include interacting with results from one or more of the simulations. For example, a system may include a framework, an integrator and a plurality of simulators where the integrator provides for framework and simulator interactions (e.g., framework and analyzer interactions) as to simulation results (e.g., as well as, for example, control of one or more of the plurality of simulators).

As an example, a physical environment may include a chemical plant, water treatment works, an electricity generator and distribution network, an airplane and associated aerodynamics, a control system, fuel tank equipment, engines, a ship, etc. As an example, a scenario analyzer may be configured to process financial information (e.g., and optionally in response to one or more processes associated with a physical environment). As an example, a physical environment may include a natural environment model (e.g., a weather model, an ocean currents model, etc.). As an example, a physical environment may include transportation equipment, for example, for transport of a resource or resources. For example, a scenario may include parameters for weather, ocean currents and one or more ships (e.g., for transport of oil, gas, etc.)

As an example, an interaction may include a user entering one or more commands via a user interface. For example, an interaction may include an end-user entering a right-click to "Delete Results". In such an example, an integrator may help process a method call to a method such as "System.Results-.DeleteResults(someCase)" where the results of a scenario (e.g., a case) may be deleted (e.g., to free space, clear entries in a GUI, etc.). As an example, a system may include one or more components for determining if a called for action is 'offered' by an analyzer associated with a specified scenario instance (e.g., by the system querying for a particular engagement, (and optionally looking at settings of an engagement which it may finds). In such an example, if not available, a context menu item (e.g., a right-click context menu item) may be automatically disabled or removed, the call may throw an exception or no-ops occur. In such an example, the system may be a learning system, enabled via an integrator, which may enhance user experience and learn about capabilities of an analyzer (e.g., simulator, etc.). Such learning may be stored to memory in a manner whereby discovery of the same analyzer (e.g., analyzer type) causes engagement settings to be loaded that may enhance user experience (e.g., diminish requests for unavailable functionalities). As to the deletion example, where such an engagement is enabled, a call to an analyzer's implementation of the deletion engagement may cause results stored in a storage medium to be deleted/abandoned (e.g., one or more pointers, file names, etc., removed).

As an example, a results engagement may provide for manipulation of results by an end-user such as instructions to compress data (e.g., loss-less or some specified decimation/sub-sampling, etc.) to save space, specifying storage location or specify attributes (e.g., quality, access rights, etc.), to send an instruction to remove current results (e.g., clearing out data with limited value, incorrect in some way, etc.).

Figure 6:
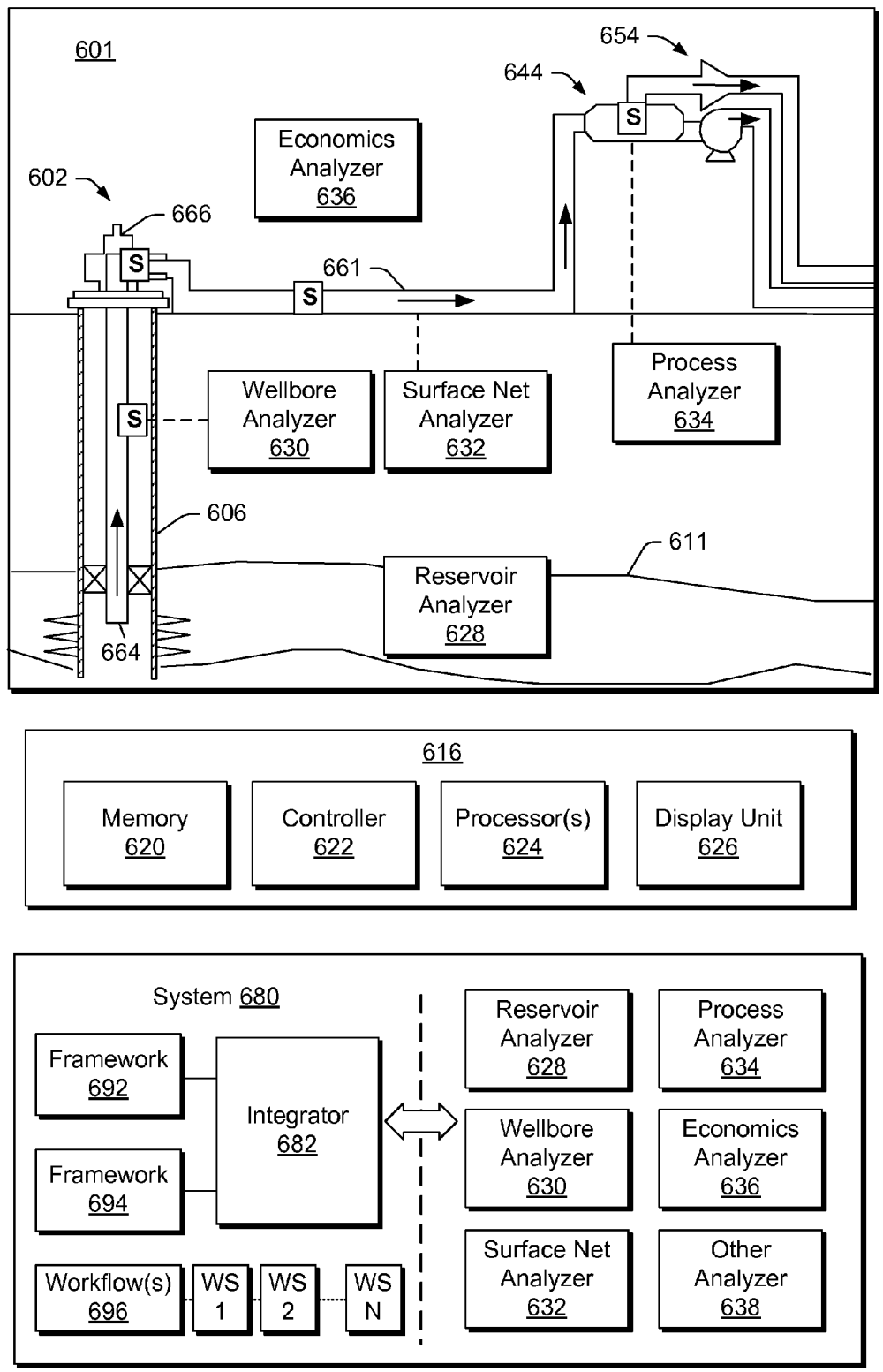
FIG. 6 illustrates an example of a geologic environment and equipment and an example of a system.

FIG. 6 shows an example of a schematic view of a portion of a geologic environment 601 that includes equipment and an example of a system 680. As shown in FIG. 6, the environment 601 includes a wellsite 602 and a network 644. The wellsite 602 includes a wellbore 606 extending into earth as completed and prepared for production of fluid from a reservoir 611.

In the example of FIG. 6, wellbore production equipment 664 extends from a wellhead 666 of the wellsite 602 and to the reservoir 611 to draw fluid to the surface. As shown, the wellsite 602 is operatively connected to the network 644 via a transport line 661. As indicated by various arrows, fluid can flow from the reservoir 611, through the wellbore 606 and onto the network 644. Fluid can then flow from the network 644, for example, to one or more fluid processing facilities.

In the example of FIG. 6, sensors (S) are located, for example, to monitor various parameters during operations. The sensors (S) may measure, for example, pressure, temperature, flowrate, composition, and other parameters of the reservoir, wellbore, gathering network, process facilities and/or other portions of an operation. As an example, the sensors (S) may be operatively connected to a surface unit 616 (e.g., to instruct the sensors to acquire data, to collect data from the sensors, etc.).

In the example of FIG. 6, the surface unit 616 can include computer facilities, such as a memory device 620, a controller 622, one or more processors 624, and display unit 626 (e.g., for managing data, visualizing results of an analysis, etc.). As an example, data may be collected in the memory device 620 and processed by the processor(s) 624 (e.g., for analysis, etc.). As an example, data may be collected from the sensors (S) and/or by one or more other sources. For example, data may be supplemented by historical data collected from other operations, user inputs, etc. As an example, analyzed data may be used to in a decision making process.

In the example of FIG. 6, a transceiver (not shown) may be provided to allow communications between the surface unit 616 and one or more pieces of equipment in the environment 601. For example, the controller 622 may be used to actuate mechanisms in the environment 601 via the transceiver, optionally based on one or more decisions of a decision making process. In such a manner, equipment in the environment 601 may be selectively adjusted based at least in part on collected data. Such adjustments may be made, for example, automatically based on computer protocol, manually by an operator or both. As an example, one or more well plans may be adjusted (e.g., to select optimum operating conditions, to avoid problems, etc.).

To facilitate data analyses, one or more analyzers may be implemented (e.g., optionally via the surface unit 616 or other unit, system, etc.). As an example, data fed into one or more analyzers may be historical data, real time data or combinations thereof. As an example, analysis through one or more analyzers may be repeated or adjusted based on the data received.

In the example of FIG. 6, analyzers can include a reservoir analyzer 628, a wellbore analyzer 630, and a surface network analyzer 632, a process analyzer 634 and an economics analyzer 636. As an example, the reservoir analyzer 628 may be configured to solve for hydrocarbon flow rate through a reservoir and into one or more wellbores. As an example, the wellbore analyzer 630 and surface network analyzer 632 may be configured to solve for hydrocarbon flow rate through a wellbore and a surface gathering network of pipelines. As to the process analyzer 634, it may be configured to model a processing plant where fluid containing hydrocarbons is separated into its constituent components (e.g., methane, ethane, propane, etc.), for example, and prepared for further distribution (e.g., transport via road, rail, pipe, etc.) and optionally sale. As an example, the economics analyzer 636 may be configured to model costs associated with at least part of an operation.

In the example of FIG. 6, the system 680 includes an integrator 682 for integration of one or more of the analyzers 628, 630, 632, 634, 636 and 638 with one or more frameworks 692 and 694. As an example, the integrator 682 and optionally multiple integrators may allow for creating, processing, etc. one or more workflows that may optionally include performing one or more analyses using one or more of the analyzers 628, 630, 632, 634, 636 and 638. For example, a workflow 696 may be performed using the framework 692 that includes a workstep (e.g., WS 1) that runs a scenario on the reservoir analyzer 628 and another workstep (e.g., WS 2) that runs a scenario on the wellbore analyzer 630. In such an example, the framework 692 may provide one or more user interfaces to view results received from the analyzer 628, the analyzer 630 or both. In turn, a user may interact with the framework 692 via one or more user interfaces, for example, to perform a subsequent workstep, another workflow, define one or more additional scenarios, etc. As an example, consider a method that includes defining one or more additional scenarios based on results from one or more analyzers where at least one of the one or more additional scenarios may be defined for execution on a different analyzer.

The example of FIG. 6, particularly the system 680, which includes the integrator 682, may allow a user to assess various scenarios associated with the geologic environment, for example, optionally include equipment therein (e.g., or to be provided therein, etc.). As an example, where multiple instances of frameworks may be provided, a method may include parallel processing, for example, to leverage resources of the multiple frameworks (e.g., whether for a single analyzer or for multiple analyzers).

As an example, a framework may include a module that may receive as input data from a plurality of analyzers and analyze such data, for example, as to sensitivity with respect to one or more parameters of a scenario or scenarios (e.g., as run by the plurality of analyzers). As an example, consider a system that includes a surface network analyzer and a reservoir analyzer plugged-in to a framework where the framework provides for analysis of results from the analyzers.

As an example, an oilfield network may modeled using a network analyzer that may aim to solve for flow conditions by identifying pressure drop (e.g., pressure differential), for example, through use of momentum equations. As an example, an equation for pressure differential may account for factors such as fluid potential energy (e.g., hydrostatic pressure), friction (e.g., shear stress between conduit wall and fluid), and acceleration (e.g., change in fluid velocity). As an example, an equation may be expressed in terms of static reservoir pressure, a flowing bottom hole pressure and flowrate. As an example, equations may account for vertical, horizontal or angled arrangements of equipment. Various examples of equations may be found in a multiphase flow simulator such as the simulator of the PIPESIM™ simulation framework (Schlumberger Limited, Houston, Tex.), which may be implemented for design and diagnostic analysis of oil and gas production systems. A manual for the PIPESIM™ simulation framework (PIPESIM Suite User Guide, 2005) includes information, for example, for building a model; fluid and multiphase flow modeling; reservoir, well and completion modeling; field equipment modeling; and operations (e.g., artificial lift, gas lift, wax prediction, nodal analysis, network analysis, field planning, multi-well analysis, etc.).

As an example, an integrator may allow a framework to interact with a plurality of analyzers. As an example, an integrator may be implemented using the OCEAN® framework environment such that an analyzer may interact with the PETREL® framework. In such an example, the analyzer may be plugged-in to the OCEAN® framework environment in a manner that provides interaction with the PETREL® framework via one or more existing interfaces thereto in the OCEAN® framework environment. As an example, an analyzer may define and encapsulate input (e.g., including model and data input plus arguments) as cases (e.g., hosted in a "cases tree" in the PETREL® framework). As an example, for iterative workflows there may be multiple scenarios or a sequence of alterations or associated input modifiers encapsulated as an iterative scenario.

As an example, a scenario definition may be implemented along with an analyzer (e.g., or analyzers) to store both input settings and host or marshal related results. As an example, results may be of native types of a framework (see, e.g., line plots of FIG. 7 and grid results of FIG. 8), and/or extensible to support custom types (see, e.g., FIG. 9), optionally including non-time series output.

Figure 7:
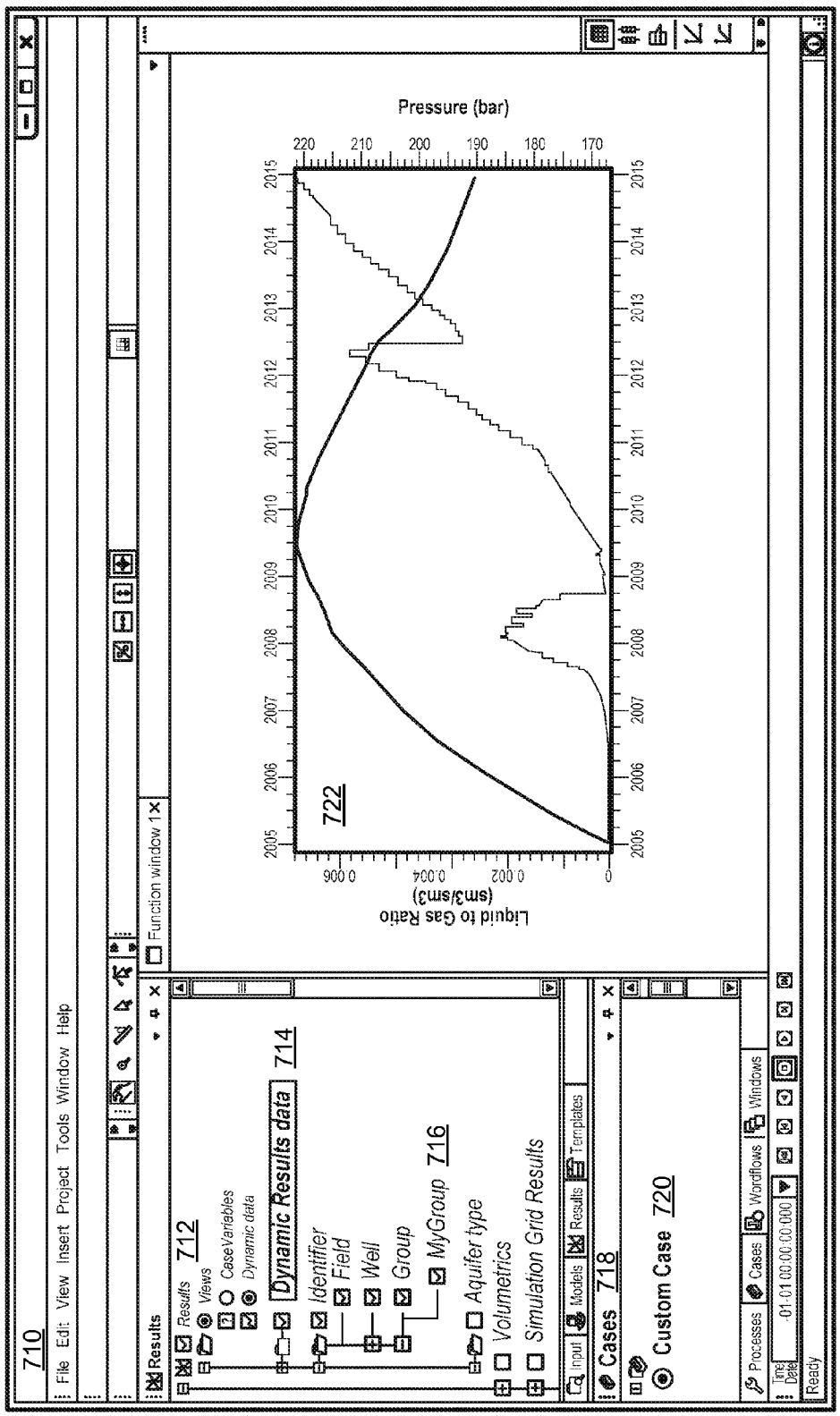
FIG. 7 illustrates an example of a graphical user interface.

FIG. 7 shows an example of a graphical user interface (GUI) 710 associated with a framework for presentation of results 712 selectable from a menu where the results are provided to the framework at least in part by an analyzer via an integrator. As shown, dynamic results data 714 are selected from various results options that include a "MyGroup" results 716, which may be, for example, available by defining a workstep to run a case in the analyzer. For example, as shown in a cases menu 718, a custom case 720 may be defined and selected, which may cause the framework to access results for that case. As an example, the defined custom case may cause the framework to control the analyzer to run a custom case and provide results for that custom case. In turn, the framework may cause a computing system to render one or more user interfaces to a display that allow a user to select the results and render results to the display. As an example, a plotting module of the framework may provide for rendering a plot 722 of results to a display.

Figure 8:
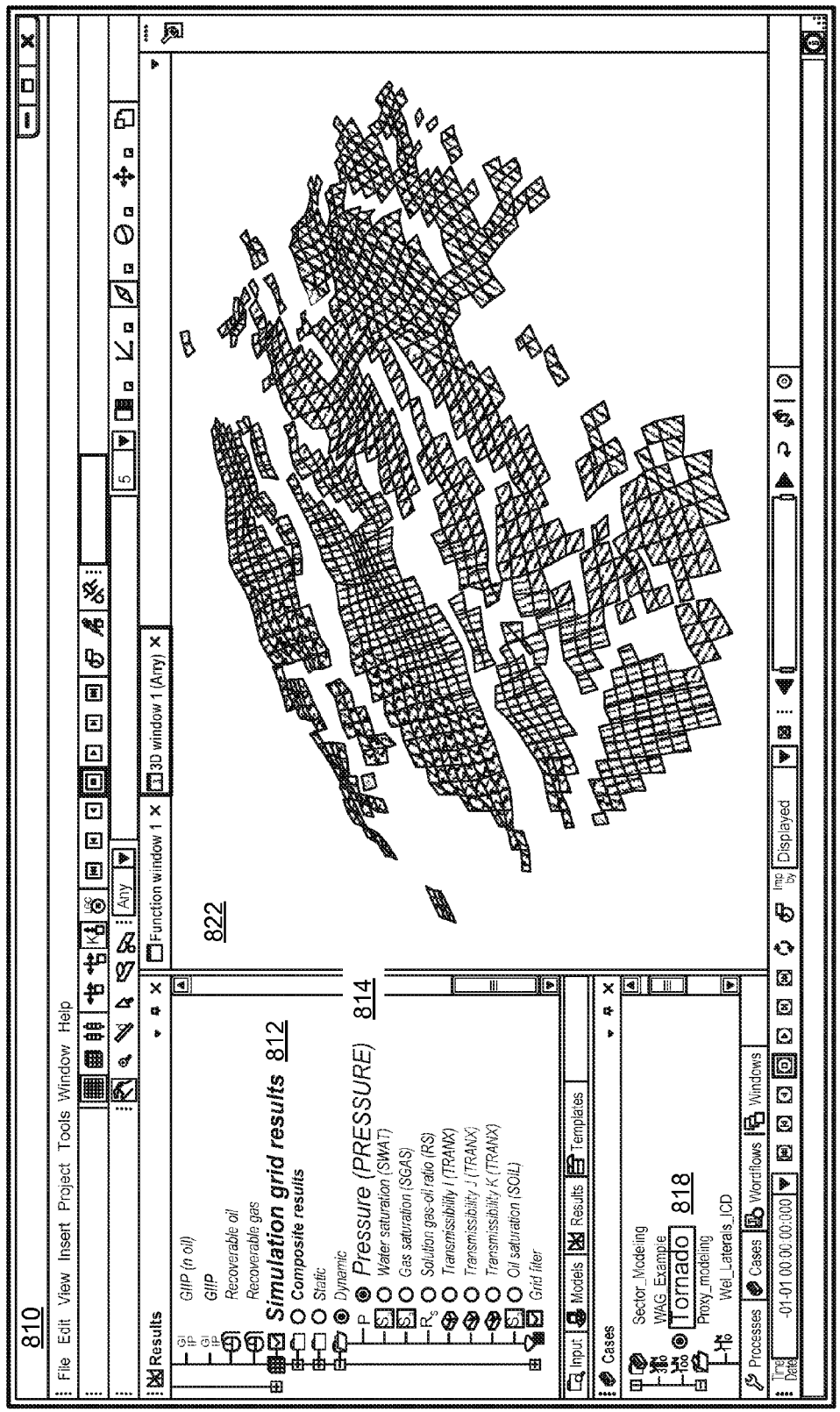
FIG. 8 illustrates an example of a graphical user interface.

FIG. 8 shows an example of a graphical user interface (GUI) 810 that includes an example of grid results 822 rendered within the GUI 810. For example, a workstep of a workflow being performed on a framework may call for transmitting a case 818 (e.g., case parameters, etc.) to an analyzer via an integrator where the analyzer can analyze a geologic environment using a grid, which may be provided to the analyzer by the framework (e.g., via the integrator). In turn, the analyzer may transmit to the framework, via the integrator, simulation grid results 812 that include, for example, pressure results 814. As shown, the grid results 822 may be for pressures 814 in a geologic environment for a particular case 818. As an example, the analyzer itself may not include a module to render the grid results 822 in such a manner.

As an example, through use of an integrator, a framework may instruct a computing system to render one or more GUIs to a display along with various options that allow a user to examine the results, transform the results, manipulate the results, combine the results with other results, etc. As to the nature of the one or more GUIs, they may be determined in part by one or more characteristics of an analyzer (e.g., type of analyzer, type of case or cases, results provided by the analyzer, etc.).

As an example, functionality of a framework accessible to a user may be, for example, based in part on one or more characteristics of an analyzer. In such a manner, a user may create a workstep or worksteps to be performed in part by the framework where the workstep or worksteps include specifying a case (or cases) to be run by the analyzer where results of the case (or cases) may be returned to the framework and examined, etc. using functionality of the framework.

Figure 9:
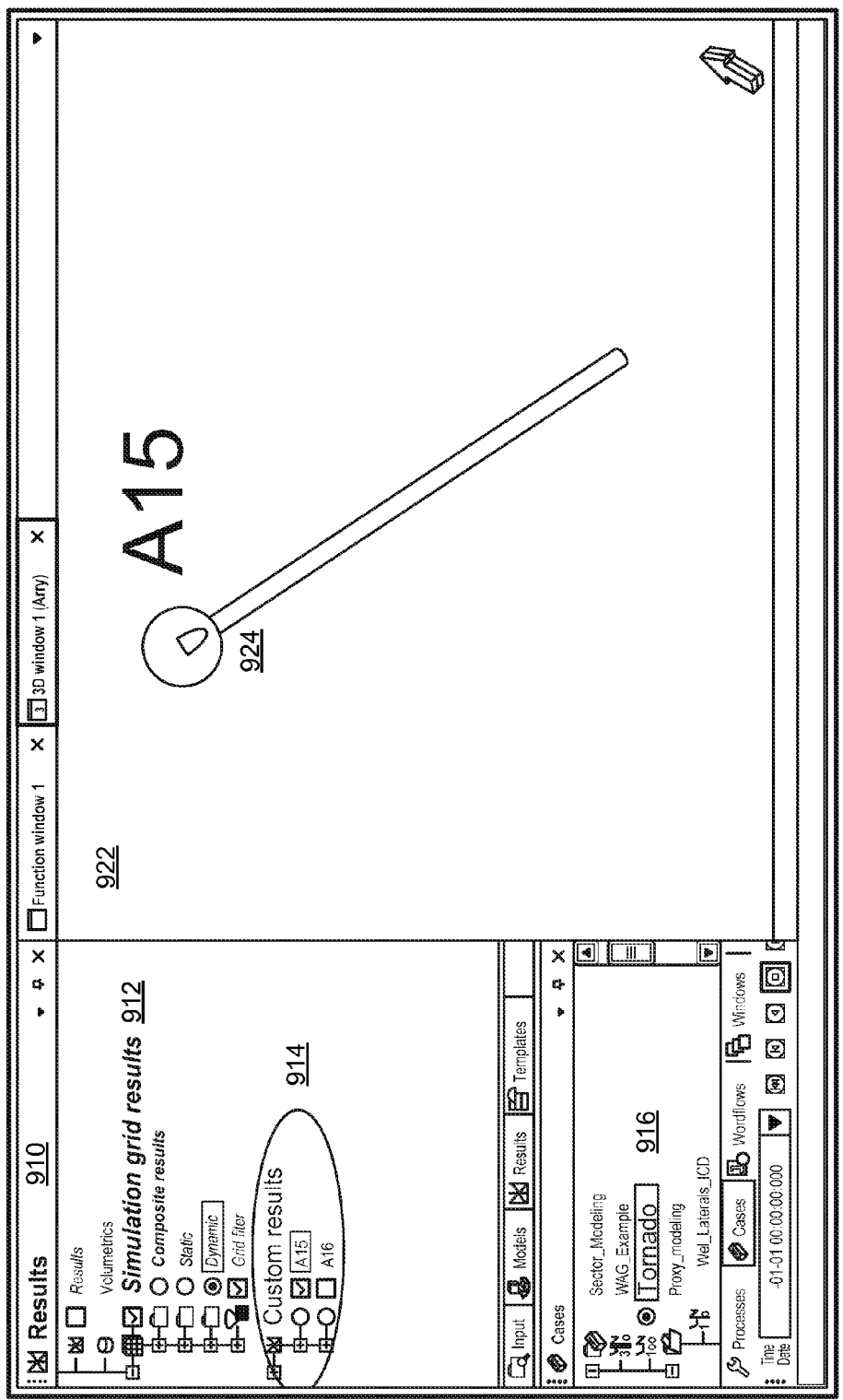
FIG. 9 illustrates an example of a graphical user interface.

FIG. 9 shows an example of a graphical user interface (GUI) 910 that includes an option for presentation of simulation grid results 912 including custom results 914 associated with one or more wells (e.g., A15 and A16). As shown, the custom results for the well A15 are selected and in a pane 922 a rendering of results for the well A15 are shown. In such an example, the results may correspond to a case, for example, a case 916 (e.g., "Tornado").

As shown in the example of FIG. 9, the GUI 910 allows a user to view one or more cases and results for such cases. The results may be received by a framework responsive to transmission of case parameters to an analyzer plugged-in to the framework via an integrator, for example, where the analyzer runs a case according to the case parameters and then transmits case results to the framework. As shown, the GUI 910 may be rendered to a display by the framework where a user can readily select the case and associated results and utilize functionality of the framework for rendering selected results visually to a display. As an example, the framework may provide for using at least a portion of the results (e.g., results data, etc.) in a workstep of a workflow, which may optionally include using a different analyzer.

As an example, a functional module may be integrated into an uncertainty and optimization framework (e.g., of the PETREL® framework), for example, for driving optimization, uncertainty and proxy workflows. As an example, an optimization framework may be extensible, so that any type of optimizer, sampler, proxy or distribution that is integrated can be operated as part of a workstep, workflow, etc. As an example, a workflow itself may be customizable and may be extended with custom worksteps that become an integrated part of the workflow.

Figure 10:
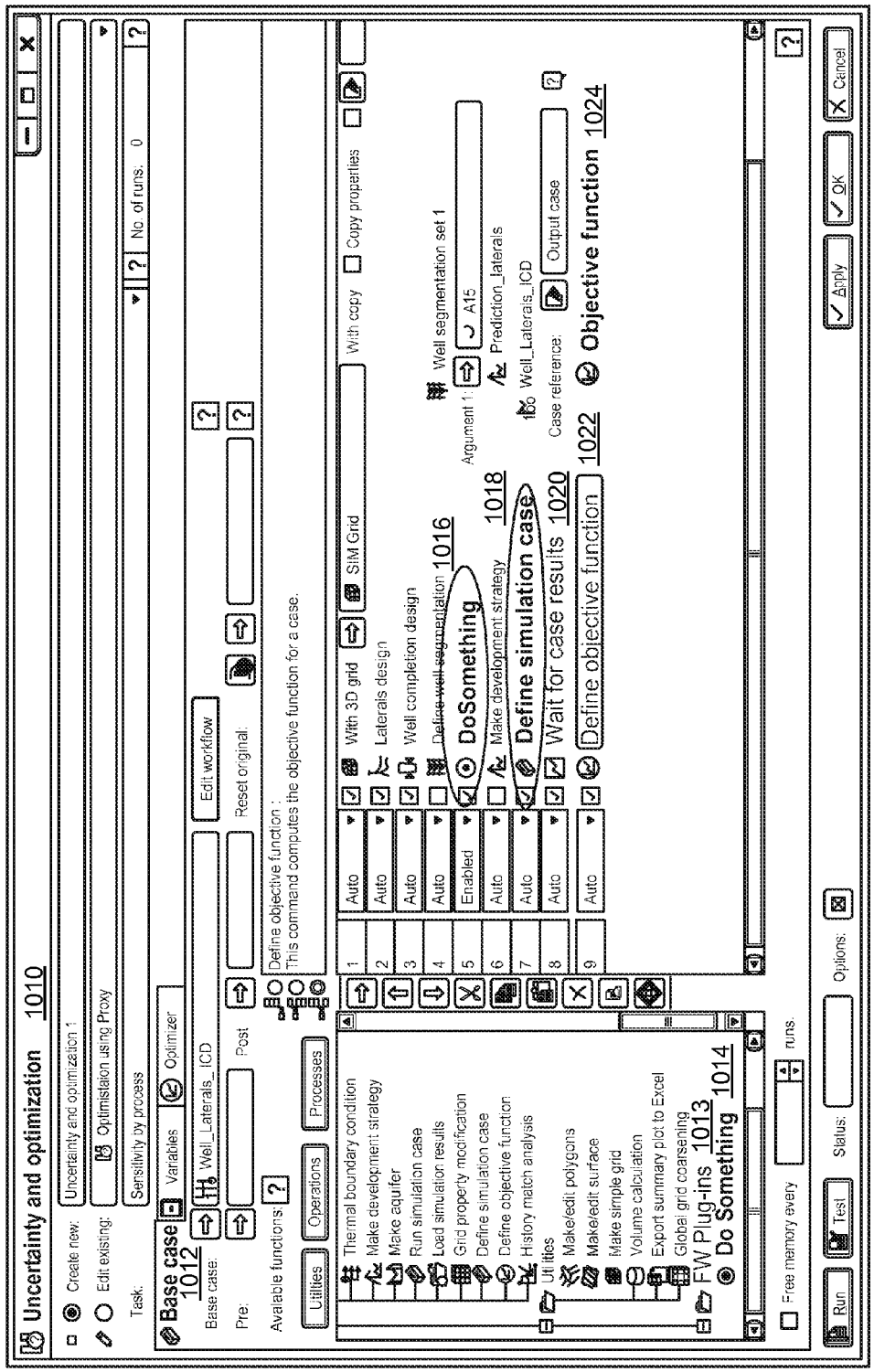
FIG. 10 illustrates an example of a graphical user interface.

FIG. 10 shows an example of a graphical user interface (GUI) 1010 that includes an example of an optimization workflow that includes native (e.g., native to a framework) and plugged-in (e.g., non-native to a framework) worksteps. As to the plugged-in worksteps, these may be driven by a workflow being performed by a framework, for example, via one or more integrators that provide for interactions with one or more analyzers.

In the example of FIG. 10, the worksteps may drive an analyzer and be evaluated by an objective function (e.g., which may be extensible). As shown in FIG. 10, an analyzer may be included as part of a workflow (e.g., an uncertainty workflow). As shown in the example of FIG. 10, a base case 1012 may be defined as including access to an analyzer via a plug-in option 1013, for example, referred to as "do something" 1014 (e.g., a particular task or tasks associated with a workflow). As indicated the "do something" workstep 1016 (e.g., or task) is enabled as workstep number 5 in a series of 9 worksteps illustrated (e.g., noting that a workflow may include fewer or more worksteps). As indicated in the example of FIG. 10, the "do something" workstep 1016 precedes a "define simulation case" workstep 1018 a workflow, which may depend at least in part on results from the "do something" workstep 1016. Further, the simulation case workstep 1018 may implement an integrator to pass case information to an analyzer to run the simulation case. As indicated by a "wait for case results" workstep 1020 (see workstep number 8), the workflow being performed by the framework may wait for results from the integrated analyzer (e.g., integrated via an integrator component). As to workstep number 9, it includes defining an objective function 1022, which may allow a user to create, select, edit, etc. an objective function 1024. In such an example, the objective function 1024 may be used to analyze the results of an analyzer and, for example, use such input to create output for a next round of calculations.

Figure 11:
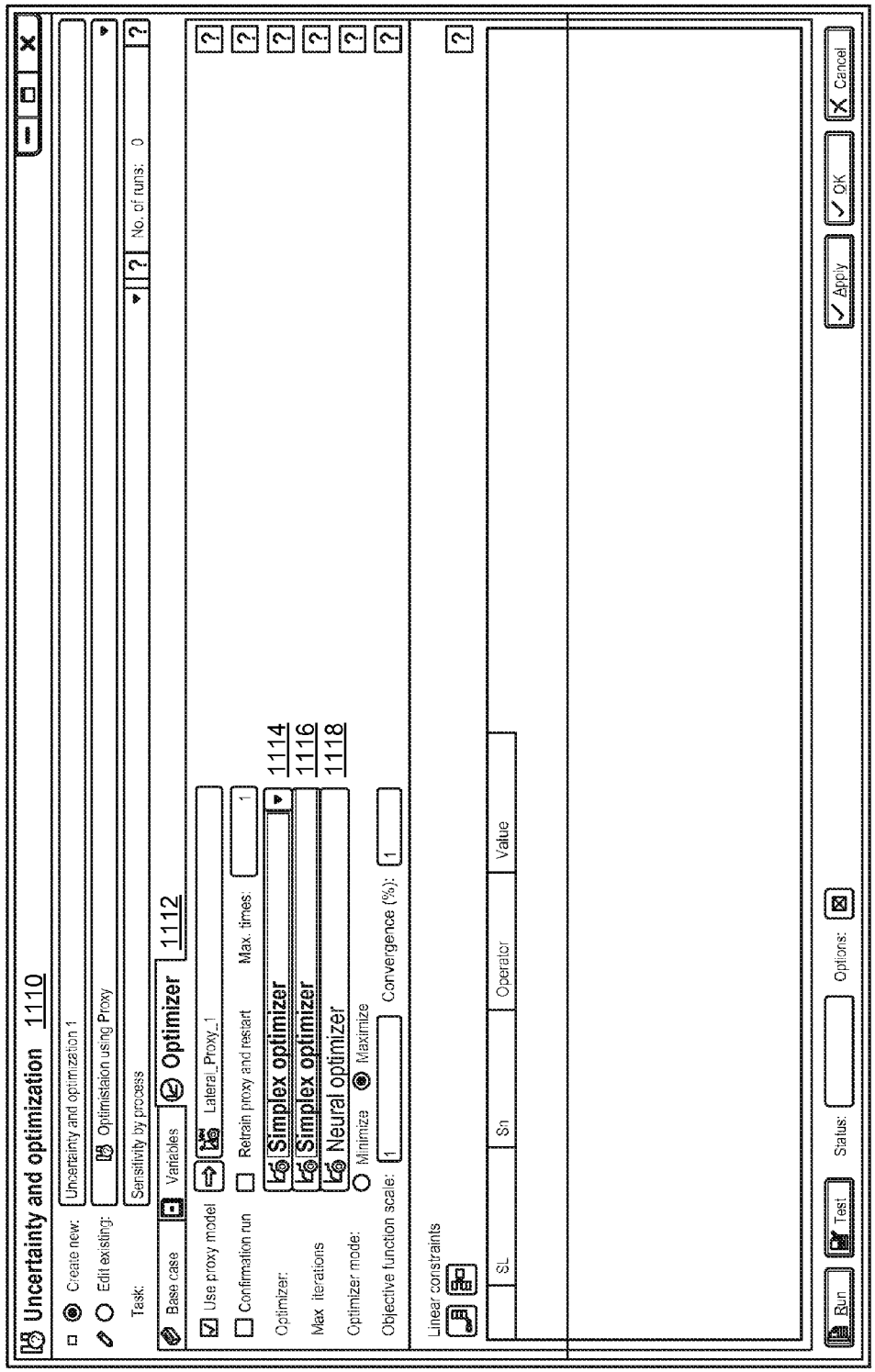
FIG. 11 illustrates an example of a graphical user interface.

FIG. 11 shows an example of a graphical user interface (GUI) 1110. In the example of FIG. 11, the GUI 1110 includes an optimizer tab 1112 that may be selected to provide controls for specifying one or more optimizers such as one or more of the optimizers 1114 (e.g., simplex), 1116 (e.g., simplex) and 1118 (e.g., neural), for example, where the list of selectable optimizers may be extensible. As indicated, the optimizer tab 1112 may provide for associating one or more optimizers with a base case (e.g., a base scenario) as well as variables. In the example of FIG. 11, variables may be used as input by framework plug-ins (e.g., plug-ins for the PETREL® framework, the OCEAN® framework, etc.) for one or more components of a system, which may include worksteps where the variables can manipulate one or more parts of the arguments the workstep operates on.

Figure 12:
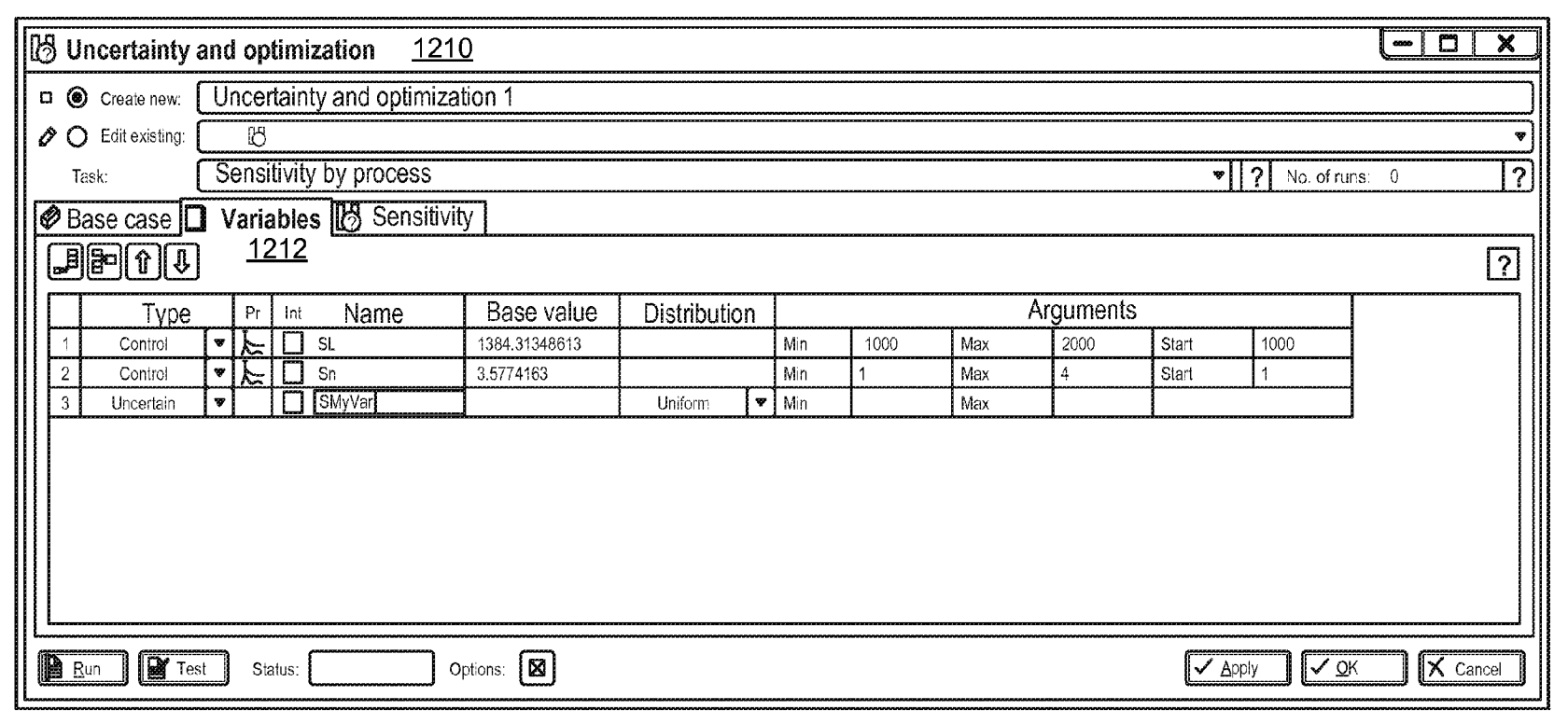

FIG. 12 shows an example of a graphical user interface (GUI) 1210 that includes examples of various fields and graphical controls including information viewable under a variables tab 1212. In the example of FIG. 12, variables associated with a workflow are shown (e.g., distributions extensible) where such variables may be used, for example, in plugged-in (e.g., non-native) and native worksteps of a framework.

Figure 13:
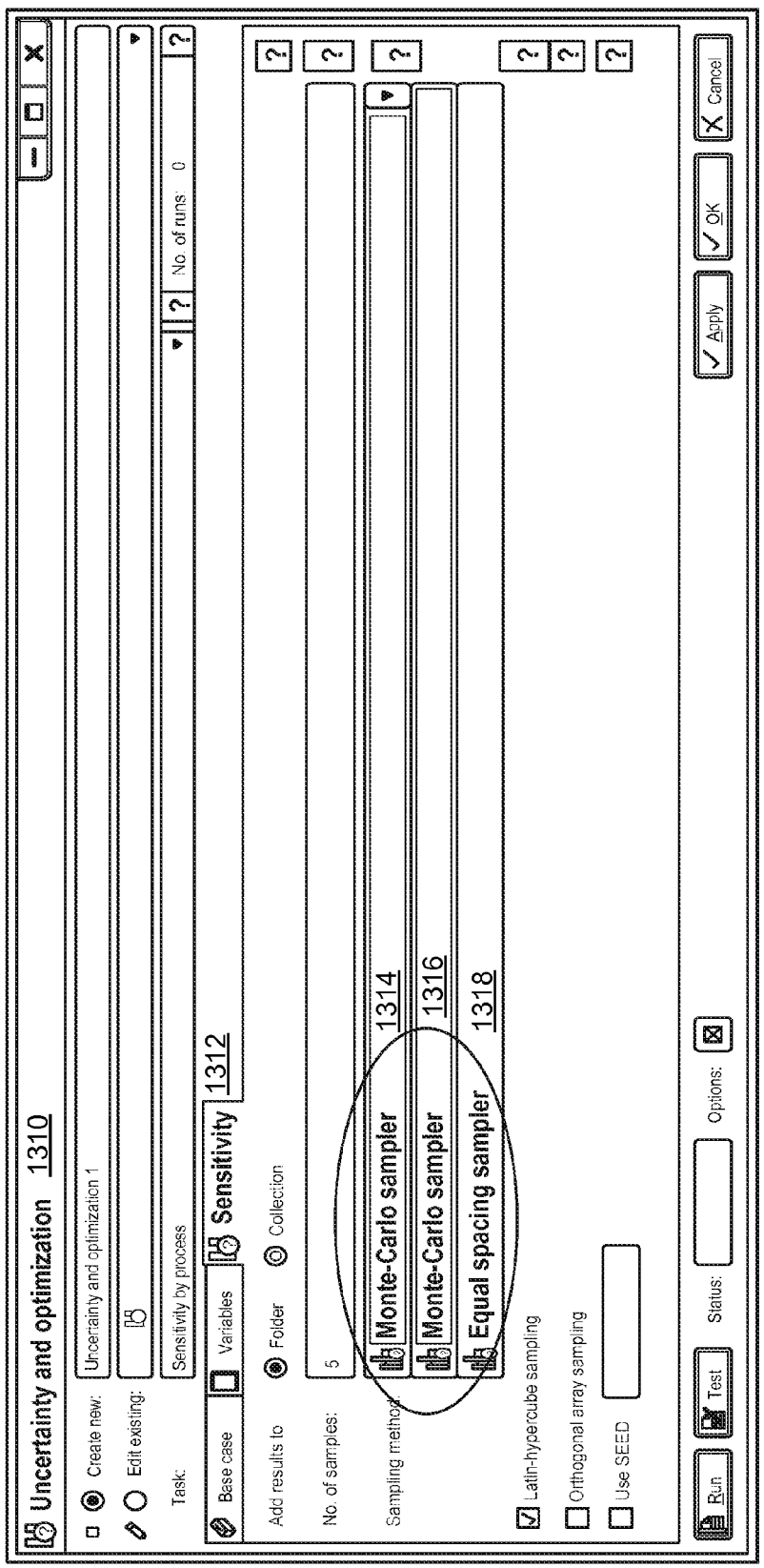
FIG. 13 illustrates an example of a graphical user interface.

FIG. 13 shows an example of a graphical user interface (GUI) 1310 that includes a sensitivity tab 1312, for example, to provide for sensitivity related selections for a base case. In the example of FIG. 13, the sensitivity tab 1312 allows for selection of one or more samplers such as one or more of samplers 1314, 1316 and 1318 (e.g., a Monte-Carlo sampler and an equal spacing sampler). Such samplers may optionally be selected using a graphical control, for example, for customizing a workflow. For example, a workflow pertaining to uncertainty and optimization may include one or more samplers.

As an example, a system can include a framework and an integrator for integrating a plurality of analyzers. In such an example, the framework may include one or more native functional modules and the integrator may provide for integration of one or more pluggable functional modules (e.g., analyzer modules). The framework may include features that allow for so-called "customized" analyzers (e.g., where an analyzer is customized by leveraging functionality of the framework), worksteps, workflows or other constructs (e.g., objects, etc.). As an example, an integrator may allow for integration of functionality of one or more analyzers, for example, to provide for a customized analyzer, workstep, workflow, etc. As an example, an integrator may act to "plug-in" a module or modules (e.g., modules of an analyzer).

As an example, a framework may include one or more modules that provide for context menu items for one or more custom cases (e.g., custom scenarios). A custom case may specify use of an analyzer plugged-in to a framework. Given a custom case, for example, as specified or selected in a menu, an application programming interface for a framework may act to create the custom case, for example, according to one or more case types for export to a plugged-in analyzer and for import of results from the plugged-in analyzer.

As an example, an application programming interface for a framework may call for creation of an object to represent one or more custom case types. Where tree results may be provided, information calculated according to a custom case may be optionally added to a results tree (e.g., consider a tree structure in the PETREL® framework).

As an example, an application programming interface for a framework may call for creation of a custom case collection. A framework may include functionality to exporting results for a custom case, for example, to a file (e.g., from a results tree).

As an example, a framework may include functionality to allow for creation of one or more custom domain objects. As an example, such objects may optionally be added to a results object that may include a graphic control (e.g., for ease of access by a user). As to results, a framework may include functionality for output of results, for example, to plot results associated with a custom case.

As an example, a framework may include functionality for removing one or more custom cases, results of custom cases, etc. As an example, a framework may provide for settings as to one or more custom cases, for example to show common case functionality.

As an example, a system can include functional modules native to the system, an analyzer, and an integrator for plugging in one or more functional modules of the analyzer (e.g., non-native functional modules).

As an example, a system can include an optimizer that provides for an optimization workflow. In such an example, the optimization workflow can include at least one workstep driving the analyzer where the analyzer includes one or more functional modules plugged into the system via the integrator. As an example, an optimization workflow can include one or more functional modules native to a system and one or more functional modules plugged into the system via an integrator. As an example, a system may include at least one functional module plugged into the system that provides for a custom type of result based on output of an analyzer.

As an example, a system can include a sampler for inclusion in a workflow. As an example, a system can include one or more modules that render information for a graphical user interface that includes fields to display at least one variable associated with at least one functional modules native to the system and to display at least one variable associated with at least one functional module plugged into the system via an integrator (e.g., one or more analyzer modules). In such an example, the variables may include workstep variables.

As an example, a method can include receiving a signal from a graphical control and, responsive to receipt of the signal, creating a custom analyzer object that includes one or more functional modules accessible via a plug-in interface (e.g., one or more functional modules of an analyzer or analyzers). Such a method may include executing the custom analyzer object at least in part by accessing at least one of the one or more functional modules via the plug-in interface. As an example, a method may include generating output information responsive to executing a custom analyzer and optionally rendering the output information to a display based at least in part on accessing one of the one or more functional modules via the plug-in interface. A method may include, for example, executing a custom analyzer as part of a workflow.

As an example, one or more computer-readable media can include computer-executable instructions to instruct a computing system to: create a custom analyzer by accessing one or more functional modules via a plug-in interface; execute the custom analyzer to analyze a scenario; and output results based on execution of the custom analyzer. As an example, instructions may be provided to instruct the computing system to access data for a sedimentary basin where the customer analyzer analyzes a scenario related to the sedimentary basin. As an example, instructions may be provided to instruct the computing system to render a graphical user interface that includes a graphical control for specifying functionality of the custom analyzer.

In an example embodiment, one or more computer-readable media may include computer-executable instructions to instruct a computing system to output information for controlling a process. For example, such instructions may provide for output to sensing process, an injection process, drilling process, an extraction process, etc.

Figure 14:
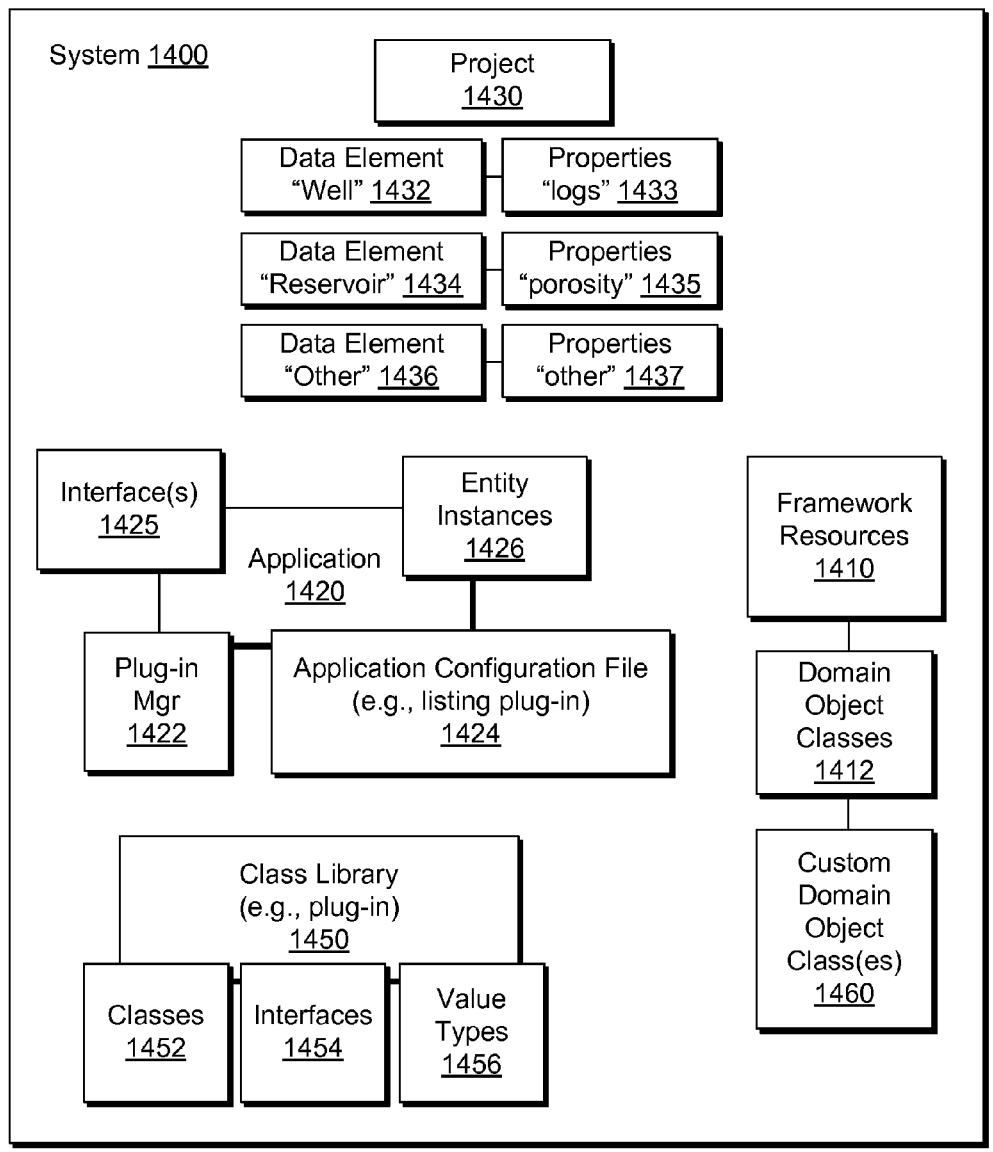
FIG. 14 illustrates an example of a system and an example of a method.
Figure 14:
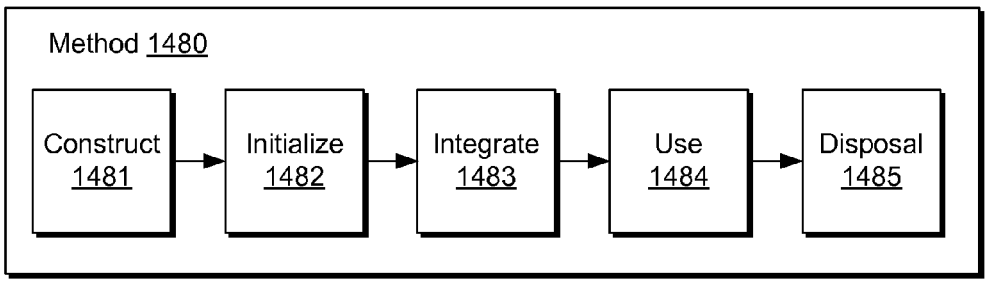

FIG. 14 shows an example of a system 1400 and an example of a method 1480. As to the system 1400, it can include framework resources 1410, an application 1420, a project 1430, and classes in the form of a plug-in class library 1450, one or more custom domain object classes 1460 or both a plug-in class library 1450 and one or more custom domain object classes 1460.

In the example of FIG. 14, the application 1420 can include a plug-in manager 1422, an application configuration file 1424, one or more interfaces 1425 and entity instances 1426. An entity instance may carry geometry of an entity object it represents where a property object carries property values associated with that entity. For example, the project 1430 includes a data element for a well 1432, a data element for a reservoir 1434 and a data element for another feature 1436. In such an example, the data elements 1432, 1434 and 1436 represent entities that are characterized by corresponding properties such as log values 1433, porosity values 1435 and other values 1437. These types of data (e.g., entity and property) may be exposed via domain object classes 1412 of the framework resources 1410, as implemented by the application 1420.

In the example of FIG. 14, classes may be provided via the class library 1450, for example, in the form of plug-ins. As shown, the library 1450 may include classes 1452, interfaces 1454 and value types 1456. The application 1420 may allow for use of the library 1450 via the plug-in manager 1422 that accesses the application configuration file 1424. In such an arrangement, the plug-in manager 1422 may allow for registration and use of the library 1450.

As shown in FIG. 14, the method 1480 includes a construct block 1481, an initialize block 1482, and integrate block 1483, a use block 1484 and a disposal block 1485. Such a method may provide for use of one or more plug-ins, for example, as provided by the class library 1450.

In the example of FIG. 14, the framework resources 1410 may include a module interface that defines procedures (e.g., methods) such as those of the method 1480. For example, such a module interface may include methods for construction, initialization, integration, presentation integration, disintegration, and disposal of a plug-in module. Consider the following scenario where during startup of an application, a construction method may load a module as defined in the configuration file for an application and proceed to instantiate the module. Following construction, an initialization method may register any services provided by the module, which may allow for consumption of such services to one or more other modules. After initialization, an integration method can involve consumption of registered services. Where appropriate, an integrate presentation method makes user interface components (menus, toolbars, context menus, windows, etc.) available. Accordingly, a user may interact with and use functionality provided by the module. After use, for example, at shut down, a disintegration method can clean up any presentation elements installed by the module. Thereafter, a disposal method can free any unmanaged resources and free any licenses acquired by the module.

Figure 15:
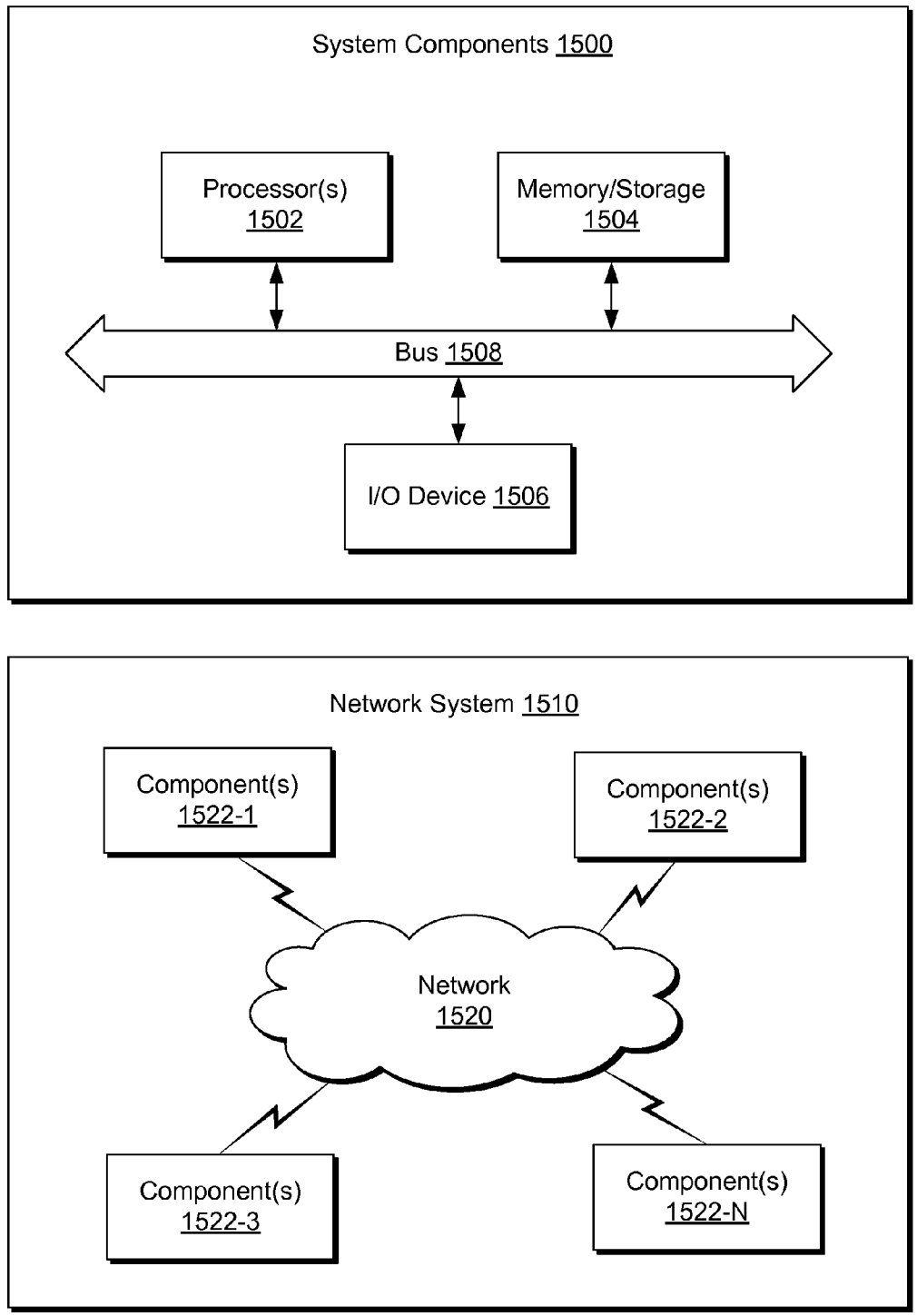
FIG. 15 illustrates example components of a system and a networked system.

FIG. 15 shows components of an example of a computing system 1500 and an example of a networked system 1510. The system 1500 includes one or more processors 1502, memory and/or storage components 1504, one or more input and/or output devices 1506 and a bus 1508. In an example embodiment, instructions may be stored in one or more computer-readable media (e.g., memory/storage components 1504). Such instructions may be read by one or more processors (e.g., the processor(s) 1502) via a communication bus (e.g., the bus 1508), which may be wired or wireless. The one or more processors may execute such instructions to implement (wholly or in part) one or more modules, components, etc. (e.g., as part of a method). A user may view output from and interact with a process via an I/O device (e.g., the device 1506). In an example embodiment, a computer-readable medium may be a storage component such as a physical memory storage device, for example, a chip, a chip on a package, a memory card, etc.

In an example embodiment, components may be distributed, such as in the network system 1510. The network system 1510 includes components 1522-1, 1522-2, 1522-3, . . . 1522-N. For example, the components 1522-1 may include the processor(s) 1502 while the component(s) 1522-3 may include memory accessible by the processor(s) 1502. Further, the component(s) 1502-2 may include an I/O device for display and optionally interaction with a method. The network may be or include the Internet, an intranet, a cellular network, a satellite network, etc.

As an example, a device may be a mobile device that includes one or more network interfaces for communication of information. For example, a mobile device may include a wireless network interface (e.g., operable via IEEE 802.11, ETSI GSM, BLUETOOTH®, satellite, etc.). As an example, a mobile device may include components such as a main processor, memory, a display, display graphics circuitry (e.g., optionally including touch and gesture circuitry), a SIM slot, audio/video circuitry, motion processing circuitry (e.g., accelerometer, gyroscope), wireless LAN circuitry, smart card circuitry, transmitter circuitry, GPS circuitry, and a battery. As an example, a mobile device may be configured as a cell phone, a tablet, etc. As an example, a method may be implemented (e.g., wholly or in part) using a mobile device. As an example, a system may include one or more mobile devices.

As an example, a system may be a distributed environment, for example, a so-called "cloud" environment where various devices, components, etc. interact for purposes of data storage, communications, computing, etc. As an example, a device or a system may include one or more components for communication of information via one or more of the Internet (e.g., where communication occurs via one or more Internet protocols), a cellular network, a satellite network, etc. As an example, a method may be implemented in a distributed environment (e.g., wholly or in part as a cloud-based service).

As an example, information may be input from a display (e.g., consider a touchscreen), output to a display or both. As an example, information may be output to a projector, a laser device, a printer, etc. such that the information may be viewed. As an example, information may be output stereographically or holographically. As to a printer, consider a 2D or a 3D printer. As an example, a 3D printer may include one or more substances that can be output to construct a 3D object. For example, data may be provided to a 3D printer to construct a 3D representation of a subterranean formation. As an example, layers may be constructed in 3D (e.g., horizons, etc.), geobodies constructed in 3D, etc. As an example, holes, fractures, etc., may be constructed in 3D (e.g., as positive structures, as negative structures, etc.).

Although only a few example embodiments have been described in detail above, those skilled in the art will readily appreciate that many modifications are possible in the example embodiments. Accordingly, all such modifications are intended to be included within the scope of this disclosure as defined in the following claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. §112, paragraph 6 for any limitations of any of the claims herein, except for those in which the claim expressly uses the words "means for" together with an associated function.

The invention claimed is:

1. A system comprising:
   a framework for scenario-based assessment of a physical environment; and
   an integrator that comprises
      an analyzer component for identifying an analyzer as one of a plurality of identifiable analyzers,
      a scenario component for framework and analyzer interactions for a scenario, and
      a results component for framework and analyzer interactions with respect to analyzer results for the scenario.

2. The system of claim 1 wherein the analyzer component is implementable by the analyzer, wherein the scenario component represents an argument pack of the analyzer, and wherein the results component is implementable by the analyzer.

3. The system of claim 1 wherein the scenario component is configurable by the analyzer component based at least in part on the analyzer component identifying the analyzer.

4. The system of claim 1 wherein the integrator further comprises an engagement component configured for framework and analyzer interactions for engagements between the framework and the identified analyzer.

5. The system of claim 4 wherein the engagement component is implementable by the analyzer.

6. The system of claim 4 wherein the engagement component comprises a plurality of implementable engagements.

7. The system of claim 6 wherein the plurality of implementable engagements comprise one or more members selected from a group consisting of results engagements, monitoring engagements, export engagements, scenario engagements and uncertainty assessment engagements.

8. The system of claim 1 wherein the framework comprises a workflow editor for associating one or more worksteps of a workflow with one or more of the plurality of identifiable analyzers.

9. The system of claim 1 wherein the framework comprises a results component for selecting analyzer results.

10. The system of claim 9 wherein the results component comprises instructions for rendering a graphical user interface to a display wherein the graphical user interface comprises one or more controls for selecting the analyzer results.

11. The system of claim 1 wherein the framework operates according to worksteps of a workflow.

12. The system of claim 11 wherein the worksteps of the workflow comprise a workstep associated with the identified analyzer and another workstep associated with another one of the plurality of identifiable analyzers.

13. The system of claim 11 wherein the worksteps of the workflow comprise an assessment workstep for assessing analyzer results from a plurality of the plurality of identifiable analyzers.

14. A method comprising:
   providing a framework for scenario-based assessment of a physical environment and an integrator that comprises an analyzer component, a scenario component, and a results component;
   identifying an analyzer as one of a plurality of identifiable analyzers via the analyzer component;
   performing framework and analyzer interactions for scenario parameters for a scenario via the scenario component;
   running the scenario on the analyzer to generate analyzer results; and
   performing framework and analyzer interactions associated with the analyzer results for the scenario via the results component.

15. The method of claim 14 further comprising providing a workflow that comprises a workstep for requesting the analyzer results.

16. The method of claim 14 further comprising providing a workflow that comprises a workstep for requesting analyzer results from another one of the plurality of identifiable analyzers.

17. The method of claim 14 further comprising performing an uncertainty assessment, using the framework, based at least in part on the analyzer results.

18. One or more computer-readable media comprising computer-executable instructions to instruct a computing system to:
   provide a framework for scenario-based assessment of a physical environment and an integrator that comprises an analyzer component, a scenario component, and a results component;
   identify an analyzer as one of a plurality of identifiable analyzers via the analyzer component;
   perform framework and analyzer interactions for scenario parameters for a scenario via the scenario component;
   run the scenario on the analyzer to generate analyzer results; and
   perform framework and analyzer interactions associated with the analyzer results for the scenario via the results component.

19. The one or more computer-readable media of claim 18 further comprising computer-executable instructions to instruct the computing system to provide an engagement component configured for framework and analyzer interactions for engagements between the framework and the identified analyzer.

20. The one or more computer-readable media of claim 19 further comprising computer-executable instructions to instruct the computing system to perform one of a plurality of engagements selected from a group consisting of results engagements, monitoring engagements, export engagements, scenario engagements and uncertainty assessment engagements.

* * * * *